(12) United States Patent
Park et al.

(10) Patent No.: US 9,984,872 B2
(45) Date of Patent: May 29, 2018

(54) FABRICATION AND STRUCTURES OF CRYSTALLINE MATERIAL

(71) Applicant: TAIWAN SEMICONDUCTOR MANUFACTURING COMPANY, LTD., Hsin-Chu (TW)

(72) Inventors: Ji-Soo Park, Andover, MA (US); James G. Fiorenza, Wilmington, MA (US)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days. days.

(21) Appl. No.: 15/406,371

(22) Filed: Jan. 13, 2017

(65) Prior Publication Data

US 2017/0133222 A1 May 11, 2017

Related U.S. Application Data

(62) Division of application No. 12/562,206, filed on Sep. 18, 2009.

(Continued)

(51) Int. Cl.
*H01L 31/117* (2006.01)
*H01L 21/02* (2006.01)
(Continued)

(52) U.S. Cl.
CPC .. *H01L 21/02532* (2013.01); *H01L 21/02057* (2013.01); *H01L 21/0262* (2013.01);
(Continued)

(58) Field of Classification Search
CPC ............... H01L 21/30625; H01L 21/0243
See application file for complete search history.

(56) References Cited

U.S. PATENT DOCUMENTS

| 4,307,510 A | 12/1981 | Sawyer et al. |
| 4,322,253 A | 3/1982 | Pankove et al. |

(Continued)

FOREIGN PATENT DOCUMENTS

| CN | 2550906 | 5/2003 |
| DE | 10017137 | 10/2000 |

(Continued)

OTHER PUBLICATIONS

Ng, "Resonant-Tunneling Diode," Complete Guide to Semiconductor Devices, Chapter 10. Nov. 3, 2010, pp. 75-83.

(Continued)

*Primary Examiner* — Samuel Gebremariam
(74) *Attorney, Agent, or Firm* — Slater Matsil, LLP

(57) ABSTRACT

A surface of the first semiconductor crystalline material has a reduced roughness. A semiconductor device includes a low defect, strained second semiconductor crystalline material over the surface of the first crystalline material. A surface of the strained second semiconductor crystalline material has a reduced roughness. One example includes obtaining a surface with reduced roughness by creating process parameters that reduce impurities at an interfacial boundary between the first and second semiconductor crystalline materials. In one embodiment, the first semiconductor crystalline material can be confined by an opening in an insulator having an aspect ratio sufficient to trap defects using Aspect Ratio Trapping techniques.

20 Claims, 10 Drawing Sheets

Related U.S. Application Data

(60) Provisional application No. 61/098,734, filed on Sep. 19, 2008.

(51) Int. Cl.
  *H01L 29/161*  (2006.01)
  *H01L 29/32*  (2006.01)

(52) U.S. Cl.
  CPC ...... *H01L 21/02381* (2013.01); *H01L 29/161* (2013.01); *H01L 29/32* (2013.01)

(56) References Cited

U.S. PATENT DOCUMENTS

| | | |
|---|---|---|
| 4,370,510 A | 1/1983 | Stirn |
| 4,545,109 A | 10/1985 | Reichert |
| 4,551,394 A | 11/1985 | Betsch et al. |
| 4,651,179 A | 3/1987 | Reichert |
| 4,727,047 A | 2/1988 | Bozler et al. |
| 4,774,205 A | 9/1988 | Choi et al. |
| 4,789,643 A | 12/1988 | Kajikawa |
| 4,826,784 A | 5/1989 | Salerno et al. |
| 4,860,081 A | 8/1989 | Cogan |
| 4,876,210 A | 10/1989 | Barnett et al. |
| 4,948,456 A | 8/1990 | Schubert |
| 4,963,508 A | 10/1990 | Umeno et al. |
| 5,032,893 A | 7/1991 | Fitzgerald, Jr. et al. |
| 5,034,337 A | 7/1991 | Mosher et al. |
| 5,061,644 A | 10/1991 | Yue et al. |
| 5,079,616 A | 1/1992 | Yacobi et al. |
| 5,091,333 A | 2/1992 | Fan et al. |
| 5,091,767 A | 2/1992 | Bean et al. |
| 5,093,699 A | 3/1992 | Weichold et al. |
| 5,098,850 A | 3/1992 | Nishida et al. |
| 5,105,247 A | 4/1992 | Cavanaugh |
| 5,108,947 A | 4/1992 | Demeester et al. |
| 5,156,995 A | 10/1992 | Fitzgerald, Jr. et al. |
| 5,159,413 A | 10/1992 | Caiviello et al. |
| 5,164,359 A | 11/1992 | Calviello et al. |
| 5,166,767 A | 11/1992 | Kapoor et al. |
| 5,223,043 A | 6/1993 | Olson et al. |
| 5,236,546 A | 8/1993 | Mizutani |
| 5,238,869 A | 8/1993 | Shichijo et al. |
| 5,256,594 A | 10/1993 | Wu et al. |
| 5,269,852 A | 12/1993 | Nishida |
| 5,269,876 A | 12/1993 | Mizutani |
| 5,272,105 A | 12/1993 | Yacobi et al. |
| 5,281,283 A | 1/1994 | Tokunaga et al. |
| 5,285,086 A | 2/1994 | Fitzgerald, Jr. |
| 5,295,150 A | 3/1994 | Vangieson et al. |
| 5,356,831 A | 10/1994 | Calviello et al. |
| 5,403,751 A | 4/1995 | Nishida et al. |
| 5,405,453 A | 4/1995 | Ho et al. |
| 5,407,491 A | 4/1995 | Freundlich et al. |
| 5,410,167 A | 4/1995 | Saito |
| 5,417,180 A | 5/1995 | Nakamura |
| 5,427,976 A | 6/1995 | Koh et al. |
| 5,432,120 A | 7/1995 | Meister et al. |
| 5,438,018 A | 8/1995 | Mori et al. |
| 5,461,243 A | 10/1995 | Ek et al. |
| 5,518,953 A | 5/1996 | Takasu |
| 5,528,209 A | 6/1996 | MacDonald et al. |
| 5,545,586 A | 8/1996 | Koh |
| 5,548,129 A | 8/1996 | Kubena |
| 5,589,696 A | 12/1996 | Baba |
| 5,621,227 A | 4/1997 | Joshi |
| 5,622,891 A | 4/1997 | Saito |
| 5,640,022 A | 6/1997 | Inai |
| 5,710,436 A | 1/1998 | Tanamoto et al. |
| 5,717,709 A | 2/1998 | Sasaki et al. |
| 5,792,679 A | 8/1998 | Nakato |
| 5,825,049 A | 10/1998 | Simmons et al. |
| 5,825,240 A | 10/1998 | Geis et al. |
| 5,849,077 A | 12/1998 | Kenney |
| 5,853,497 A | 12/1998 | Lillington et al. |
| 5,869,845 A | 2/1999 | Vander Wagt et al. |
| 5,883,549 A | 3/1999 | De Los Santos |
| 5,886,385 A | 3/1999 | Arisumi et al. |
| 5,903,170 A | 5/1999 | Kulkarni et al. |
| 5,953,361 A | 9/1999 | Borchert et al. |
| 5,959,308 A | 9/1999 | Shichijo et al. |
| 5,966,620 A | 10/1999 | Sakaguchi et al. |
| 5,998,781 A | 12/1999 | Vawter et al. |
| 6,011,271 A | 1/2000 | Sakuma et al. |
| 6,015,979 A | 1/2000 | Sugiura et al. |
| 6,049,098 A | 4/2000 | Sato |
| 6,083,598 A | 7/2000 | Ohkubo et al. |
| 6,100,106 A | 8/2000 | Yamaguchi et al. |
| 6,110,813 A | 8/2000 | Ota et al. |
| 6,111,288 A | 8/2000 | Watanabe et al. |
| 6,121,542 A | 9/2000 | Shiotsuka et al. |
| 6,150,242 A | 11/2000 | Van De Wagt et al. |
| 6,153,010 A | 11/2000 | Kiyoku et al. |
| 6,191,432 B1 | 2/2001 | Sugiyama et al. |
| 6,225,650 B1 | 5/2001 | Tadatomo et al. |
| 6,228,691 B1 | 5/2001 | Doyle |
| 6,229,153 B1 | 5/2001 | Botez et al. |
| 6,235,547 B1 | 5/2001 | Sakuma et al. |
| 6,252,261 B1 | 6/2001 | Usui et al. |
| 6,252,287 B1 | 6/2001 | Kurtz et al. |
| 6,271,551 B1 | 8/2001 | Schmitz et al. |
| 6,274,889 B1 | 8/2001 | Ota et al. |
| 6,300,650 B1 | 10/2001 | Sato |
| 6,320,220 B1 | 11/2001 | Watanabe et al. |
| 6,325,850 B1 | 12/2001 | Beaumont et al. |
| 6,339,232 B1 | 1/2002 | Takagi |
| 6,342,404 B1 | 1/2002 | Shibata et al. |
| 6,348,096 B1 | 2/2002 | Sunakawa et al. |
| 6,352,942 B1 | 3/2002 | Luan et al. |
| 6,362,071 B1 | 3/2002 | Nguyen et al. |
| 6,380,051 B1 | 4/2002 | Yuasa et al. |
| 6,380,590 B1 | 4/2002 | Yu |
| 6,403,451 B1 | 6/2002 | Linthicum et al. |
| 6,407,425 B1 | 6/2002 | Babcock et al. |
| 6,456,214 B1 | 9/2002 | van de Wagt |
| 6,458,614 B1 | 10/2002 | Nanishi et al. |
| 6,475,869 B1 | 11/2002 | Yu |
| 6,492,216 B1 | 12/2002 | Yeo et al. |
| 6,500,257 B1 | 12/2002 | Wang et al. |
| 6,503,610 B2 | 1/2003 | Hiramatsu et al. |
| 6,512,252 B1 | 1/2003 | Takagi et al. |
| 6,521,514 B1 | 2/2003 | Gehrke et al. |
| 6,552,259 B1 | 4/2003 | Hosomi et al. |
| 6,566,284 B2 | 5/2003 | Thomas, III et al. |
| 6,576,532 B1 | 6/2003 | Jones et al. |
| 6,579,463 B1 | 6/2003 | Winningham et al. |
| 6,603,172 B1 | 8/2003 | Segawa et al. |
| 6,606,335 B1 | 8/2003 | Kuramata et al. |
| 6,617,643 B1 | 9/2003 | Goodwin-Johansson |
| 6,635,110 B1 | 10/2003 | Luan et al. |
| 6,645,295 B1 | 11/2003 | Koike et al. |
| 6,645,797 B1 | 11/2003 | Buynoski et al. |
| 6,686,245 B1 | 2/2004 | Mathew et al. |
| 6,703,253 B2 | 3/2004 | Koide |
| 6,709,982 B1 | 3/2004 | Buynoski et al. |
| 6,710,368 B2 | 3/2004 | Fisher et al. |
| 6,720,196 B2 | 4/2004 | Kunisato et al. |
| 6,727,523 B2 | 4/2004 | Morita |
| 6,753,555 B2 | 6/2004 | Takagi et al. |
| 6,756,611 B2 | 6/2004 | Kiyoku et al. |
| 6,762,483 B1 | 7/2004 | Krivokapic et al. |
| 6,767,793 B2 | 7/2004 | Clark et al. |
| 6,784,074 B2 | 8/2004 | Shchukin et al. |
| 6,787,864 B2 | 9/2004 | Paton et al. |
| 6,794,718 B2 | 9/2004 | Nowak et al. |
| 6,800,910 B2 | 10/2004 | Lin et al. |
| 6,803,598 B1 | 10/2004 | Berger et al. |
| 6,809,351 B2 | 10/2004 | Kuramoto et al. |
| 6,812,053 B1 | 11/2004 | Kong et al. |
| 6,812,495 B2 | 11/2004 | Wada et al. |
| 6,815,241 B2 | 11/2004 | Wang |
| 6,815,738 B2 | 11/2004 | Rim |
| 6,825,534 B2 | 11/2004 | Chen et al. |
| 6,831,350 B1 | 12/2004 | Liu et al. |

(56) References Cited

U.S. PATENT DOCUMENTS

| | | |
|---|---|---|
| 6,835,246 B2 | 12/2004 | Zaidi |
| 6,835,618 B1 | 12/2004 | Dakshina-Murthy et al. |
| 6,838,322 B2 | 1/2005 | Pham et al. |
| 6,841,410 B2 | 1/2005 | Sasaoka |
| 6,841,808 B2 | 1/2005 | Shibata et al. |
| 6,849,077 B2 | 2/2005 | Ricci |
| 6,849,487 B2 | 2/2005 | Taylor, Jr. et al. |
| 6,849,884 B2 | 2/2005 | Clark et al. |
| 6,855,583 B1 | 2/2005 | Krivokapic et al. |
| 6,855,982 B1 | 2/2005 | Xiang et al. |
| 6,855,990 B2 | 2/2005 | Yeo et al. |
| 6,867,433 B2 | 3/2005 | Yeo et al. |
| 6,873,009 B2 | 3/2005 | Hisamoto et al. |
| 6,882,051 B2 | 4/2005 | Majumdar et al. |
| 6,887,773 B2 | 5/2005 | Gunn, III et al. |
| 6,888,181 B1 | 5/2005 | Liao et al. |
| 6,900,070 B2 | 5/2005 | Craven et al. |
| 6,900,502 B2 | 5/2005 | Ge et al. |
| 6,902,965 B2 | 6/2005 | Ge et al. |
| 6,902,991 B2 | 6/2005 | Xiang et al. |
| 6,909,186 B2 | 6/2005 | Chu |
| 6,917,068 B1 | 7/2005 | Krivokapic |
| 6,919,258 B2 | 7/2005 | Grant et al. |
| 6,920,159 B2 | 7/2005 | Sidorin et al. |
| 6,921,673 B2 | 7/2005 | Kobayashi et al. |
| 6,921,963 B2 | 7/2005 | Krivokapic et al. |
| 6,921,982 B2 | 7/2005 | Joshi et al. |
| 6,936,875 B2 | 8/2005 | Sugii et al. |
| 6,943,407 B2 | 9/2005 | Ouyang et al. |
| 6,946,683 B2 | 9/2005 | Sano et al. |
| 6,949,769 B2 | 9/2005 | Hu et al. |
| 6,951,819 B2 | 10/2005 | Iles et al. |
| 6,955,969 B2 | 10/2005 | Djomehri et al. |
| 6,955,977 B2 | 10/2005 | Kong et al. |
| 6,958,254 B2 | 10/2005 | Seifert |
| 6,960,781 B2 | 11/2005 | Currie et al. |
| 6,974,733 B2 | 12/2005 | Boyanov et al. |
| 6,977,194 B2 | 12/2005 | Belyansky et al. |
| 6,982,204 B2 | 1/2006 | Saxler et al. |
| 6,982,435 B2 | 1/2006 | Shibata et al. |
| 6,984,571 B1 | 1/2006 | Enquist |
| 6,991,998 B2 | 1/2006 | Bedell et al. |
| 6,994,751 B2 | 2/2006 | Hata et al. |
| 6,995,430 B2 | 2/2006 | Langdo et al. |
| 6,995,456 B2 | 2/2006 | Nowak |
| 6,996,147 B2 | 2/2006 | Majumdar et al. |
| 6,998,684 B2 | 2/2006 | Anderson et al. |
| 7,001,804 B2 | 2/2006 | Dietz et al. |
| 7,002,175 B1 | 2/2006 | Singh et al. |
| 7,012,298 B1 | 3/2006 | Krivokapic |
| 7,012,314 B2 | 3/2006 | Bude et al. |
| 7,015,497 B1 | 3/2006 | Berger |
| 7,015,517 B2 | 3/2006 | Grant et al. |
| 7,033,436 B2 | 4/2006 | Biwa et al. |
| 7,033,936 B1 | 4/2006 | Green |
| 7,041,178 B2 | 5/2006 | Tong et al. |
| 7,045,401 B2 | 5/2006 | Lee et al. |
| 7,049,627 B2 | 5/2006 | Vineis et al. |
| 7,061,065 B2 | 6/2006 | Horng et al. |
| 7,074,623 B2 | 7/2006 | Lochtefeld et al. |
| 7,078,299 B2 | 7/2006 | Maszara et al. |
| 7,078,731 B2 | 7/2006 | D'Evelyn et al. |
| 7,084,051 B2 | 8/2006 | Ueda |
| 7,084,441 B2 | 8/2006 | Saxler |
| 7,087,965 B2 | 8/2006 | Chan et al. |
| 7,088,143 B2 | 8/2006 | Ding et al. |
| 7,091,561 B2 | 8/2006 | Matsushita et al. |
| 7,095,043 B2 | 8/2006 | Oda et al. |
| 7,098,508 B2 | 8/2006 | Ieong et al. |
| 7,101,444 B2 | 9/2006 | Shchukin et al. |
| 7,109,516 B2 | 9/2006 | Langdo et al. |
| 7,118,987 B2 | 10/2006 | Fu et al. |
| 7,119,402 B2 | 10/2006 | Kinoshita et al. |
| 7,122,733 B2 | 10/2006 | Narayanan et al. |
| 7,125,785 B2 | 10/2006 | Cohen et al. |
| 7,128,846 B2 | 10/2006 | Nishijima et al. |
| 7,132,691 B1 | 11/2006 | Tanabe et al. |
| 7,138,292 B2 | 11/2006 | Mirabedini et al. |
| 7,138,302 B2 | 11/2006 | Xiang et al. |
| 7,154,118 B2 | 12/2006 | Lindert et al. |
| 7,160,753 B2 | 1/2007 | Williams, Jr. |
| 7,164,183 B2 | 1/2007 | Sakaguchi et al. |
| 7,176,522 B2 | 2/2007 | Cheng et al. |
| 7,179,727 B2 | 2/2007 | Capewell et al. |
| 7,180,134 B2 | 2/2007 | Yang et al. |
| 7,195,993 B2 | 3/2007 | Zheleva et al. |
| 7,198,995 B2 | 4/2007 | Chidambarrao et al. |
| 7,205,586 B2 | 4/2007 | Takagi et al. |
| 7,205,604 B2 | 4/2007 | Ouyang et al. |
| 7,211,864 B2 | 5/2007 | Seliskar |
| 7,217,882 B2 | 5/2007 | Walukiewicz et al. |
| 7,224,033 B2 | 5/2007 | Zhu et al. |
| 7,244,958 B2 | 7/2007 | Shang et al. |
| 7,247,534 B2 | 7/2007 | Chidambarrao et al. |
| 7,247,912 B2 | 7/2007 | Zhu et al. |
| 7,250,359 B2 | 7/2007 | Fitzgerald |
| 7,262,117 B1 | 8/2007 | Gunn, III et al. |
| 7,268,058 B2 | 9/2007 | Chau et al. |
| 7,297,569 B2 | 11/2007 | Bude et al. |
| 7,344,942 B2 | 3/2008 | Korber |
| 7,361,576 B2 | 4/2008 | Imer et al. |
| 7,372,066 B2 | 5/2008 | Sato et al. |
| 7,420,201 B2 | 9/2008 | Langdo et al. |
| 7,449,379 B2 | 11/2008 | Ochimizu et al. |
| 7,582,498 B2 | 9/2009 | D'Evelyn et al. |
| 7,626,246 B2 | 12/2009 | Lochtefeld et al. |
| 7,638,842 B2 | 12/2009 | Currie et al. |
| 7,655,960 B2 | 2/2010 | Nakahata et al. |
| 7,777,250 B2 | 8/2010 | Lochtefeld |
| 7,799,592 B2 | 9/2010 | Lochtefeld |
| 7,825,328 B2 | 11/2010 | Li |
| 7,875,958 B2 | 1/2011 | Cheng et al. |
| 8,034,697 B2 | 10/2011 | Fiorenza et al. |
| 2001/0006249 A1 | 7/2001 | Fitzgerald |
| 2001/0045604 A1 | 11/2001 | Oda et al. |
| 2002/0011612 A1 | 1/2002 | Hieda |
| 2002/0017642 A1 | 2/2002 | Mizushima et al. |
| 2002/0022290 A1 | 2/2002 | Kong et al. |
| 2002/0030246 A1 | 3/2002 | Eisenbeiser et al. |
| 2002/0036290 A1 | 3/2002 | Inaba et al. |
| 2002/0046693 A1 | 4/2002 | Kiyoku et al. |
| 2002/0047155 A1 | 4/2002 | Babcock et al. |
| 2002/0066403 A1 | 6/2002 | Sunakawa et al. |
| 2002/0070383 A1 | 6/2002 | Shibata et al. |
| 2002/0084000 A1 | 7/2002 | Fitzgerald |
| 2002/0127427 A1 | 9/2002 | Young et al. |
| 2002/0168802 A1 | 11/2002 | Hsu et al. |
| 2002/0168844 A1 | 11/2002 | Kuramoto et al. |
| 2002/0179005 A1 | 12/2002 | Koike et al. |
| 2003/0030117 A1 | 2/2003 | Iwasaki et al. |
| 2003/0045017 A1 | 3/2003 | Hiramatsu et al. |
| 2003/0057486 A1 | 3/2003 | Gambino et al. |
| 2003/0064535 A1 | 4/2003 | Kub et al. |
| 2003/0070707 A1 | 4/2003 | King et al. |
| 2003/0087462 A1 | 5/2003 | Koide et al. |
| 2003/0089899 A1 | 5/2003 | Lieber et al. |
| 2003/0155586 A1 | 8/2003 | Koide et al. |
| 2003/0168002 A1 | 9/2003 | Zaidi |
| 2003/0178677 A1 | 9/2003 | Clark et al. |
| 2003/0178681 A1 | 9/2003 | Clark et al. |
| 2003/0183827 A1 | 10/2003 | Kawaguchi et al. |
| 2003/0203531 A1 | 10/2003 | Shchukin et al. |
| 2003/0207518 A1 | 11/2003 | Kong et al. |
| 2003/0227036 A1 | 12/2003 | Sugiyama et al. |
| 2003/0230759 A1 | 12/2003 | Thomas, III et al. |
| 2004/0005740 A1 | 1/2004 | Lochtefeld et al. |
| 2004/0012037 A1 | 1/2004 | Venkatesan et al. |
| 2004/0016921 A1 | 1/2004 | Botez et al. |
| 2004/0031979 A1 | 2/2004 | Lochtefeld et al. |
| 2004/0041932 A1 | 3/2004 | Chao et al. |
| 2004/0043584 A1 | 3/2004 | Thomas et al. |
| 2004/0072410 A1 | 4/2004 | Motoki et al. |
| 2004/0075105 A1 | 4/2004 | Leitz et al. |
| 2004/0075464 A1 | 4/2004 | Samuelson et al. |

(56) References Cited

U.S. PATENT DOCUMENTS

| | | |
|---|---|---|
| 2004/0082150 A1 | 4/2004 | Kong et al. |
| 2004/0087051 A1 | 5/2004 | Furuya et al. |
| 2004/0092060 A1 | 5/2004 | Gambino et al. |
| 2004/0118451 A1 | 6/2004 | Walukiewicz et al. |
| 2004/0121507 A1 | 6/2004 | Bude et al. |
| 2004/0123796 A1 | 7/2004 | Nagai et al. |
| 2004/0142503 A1 | 7/2004 | Lee et al. |
| 2004/0150001 A1 | 8/2004 | Shchukin et al. |
| 2004/0155249 A1 | 8/2004 | Narui et al. |
| 2004/0173812 A1 | 9/2004 | Currie et al. |
| 2004/0183078 A1 | 9/2004 | Wang |
| 2004/0185665 A1 | 9/2004 | Kishimoto et al. |
| 2004/0188791 A1 | 9/2004 | Horng et al. |
| 2004/0195624 A1 | 10/2004 | Liu et al. |
| 2004/0227187 A1 | 11/2004 | Cheng et al. |
| 2004/0247218 A1 | 12/2004 | Ironside et al. |
| 2004/0256613 A1 | 12/2004 | Oda et al. |
| 2004/0256647 A1 | 12/2004 | Lee et al. |
| 2004/0262617 A1 | 12/2004 | Hahm et al. |
| 2005/0001216 A1 | 1/2005 | Adkisson et al. |
| 2005/0003572 A1 | 1/2005 | Hahn et al. |
| 2005/0009304 A1 | 1/2005 | Zheleva et al. |
| 2005/0017351 A1 | 1/2005 | Ravi |
| 2005/0121688 A1 | 1/2005 | Nagai et al. |
| 2005/0035410 A1 | 2/2005 | Yeo et al. |
| 2005/0040444 A1 | 2/2005 | Cohen |
| 2005/0045983 A1 | 3/2005 | Noda et al. |
| 2005/0054164 A1 | 3/2005 | Xiang |
| 2005/0054180 A1 | 3/2005 | Han et al. |
| 2005/0056827 A1 | 3/2005 | Li et al. |
| 2005/0056892 A1 | 3/2005 | Seliskar |
| 2005/0072995 A1 | 4/2005 | Anthony |
| 2005/0073028 A1 | 4/2005 | Grant et al. |
| 2005/0093021 A1 | 5/2005 | Ouyang et al. |
| 2005/0093154 A1 | 5/2005 | Kottantharayil et al. |
| 2005/0104152 A1 | 5/2005 | Snyder et al. |
| 2005/0104156 A1 | 5/2005 | Wasshuber |
| 2005/0118793 A1 | 6/2005 | Snyder et al. |
| 2005/0118825 A1 | 6/2005 | Nishijima et al. |
| 2005/0127451 A1 | 6/2005 | Tsuchiya et al. |
| 2005/0136626 A1 | 6/2005 | Morse |
| 2005/0139860 A1 | 6/2005 | Snyder et al. |
| 2005/0145941 A1 | 7/2005 | Bedell et al. |
| 2005/0145954 A1 | 7/2005 | Zhu et al. |
| 2005/0156169 A1 | 7/2005 | Chu |
| 2005/0156202 A1 | 7/2005 | Rhee et al. |
| 2005/0161711 A1 | 7/2005 | Chu |
| 2005/0164475 A1 | 7/2005 | Peckerar et al. |
| 2005/0181549 A1 | 8/2005 | Barr et al. |
| 2005/0184302 A1 | 8/2005 | Kobayashi et al. |
| 2005/0205859 A1 | 9/2005 | Currie et al. |
| 2005/0205932 A1 | 9/2005 | Cohen |
| 2005/0211291 A1 | 9/2005 | Bianchi |
| 2005/0212051 A1 | 9/2005 | Jozwiak et al. |
| 2005/0217565 A1 | 10/2005 | Lahreche et al. |
| 2005/0245095 A1 | 11/2005 | Haskell et al. |
| 2005/0263751 A1 | 12/2005 | Hall et al. |
| 2005/0274409 A1 | 12/2005 | Fetzer et al. |
| 2005/0280103 A1 | 12/2005 | Langdo et al. |
| 2006/0009012 A1 | 1/2006 | Leitz et al. |
| 2006/0019462 A1 | 1/2006 | Cheng et al. |
| 2006/0049409 A1 | 3/2006 | Rafferty et al. |
| 2006/0057825 A1 | 3/2006 | Bude et al. |
| 2006/0073681 A1 | 4/2006 | Han |
| 2006/0105533 A1 | 5/2006 | Chong et al. |
| 2006/0112986 A1 | 6/2006 | Atwater, Jr. et al. |
| 2006/0113603 A1 | 6/2006 | Currie |
| 2006/0128124 A1 | 6/2006 | Haskell et al. |
| 2006/0131606 A1 | 6/2006 | Cheng |
| 2006/0144435 A1 | 7/2006 | Wanlass |
| 2006/0145264 A1 | 7/2006 | Chidambarrao et al. |
| 2006/0160291 A1 | 7/2006 | Lee et al. |
| 2006/0162768 A1 | 7/2006 | Wanlass et al. |
| 2006/0166437 A1 | 7/2006 | Korber |
| 2006/0169987 A1 | 8/2006 | Miura et al. |
| 2006/0175601 A1 | 8/2006 | Lieber et al. |
| 2006/0186510 A1 | 8/2006 | Lochtefeld et al. |
| 2006/0189056 A1 | 8/2006 | Ko et al. |
| 2006/0197123 A1 | 9/2006 | Lochtefeld et al. |
| 2006/0197124 A1 | 9/2006 | Lochtefeld et al. |
| 2006/0202276 A1 | 9/2006 | Kato |
| 2006/0205197 A1 | 9/2006 | Yi et al. |
| 2006/0211210 A1 | 9/2006 | Bhat et al. |
| 2006/0266281 A1 | 11/2006 | Beaumont et al. |
| 2006/0267047 A1 | 11/2006 | Murayama |
| 2006/0292719 A1 | 12/2006 | Lochtefeld et al. |
| 2007/0025670 A1 | 2/2007 | Pan et al. |
| 2007/0029643 A1 | 2/2007 | Johnson et al. |
| 2007/0054465 A1 | 3/2007 | Currie et al. |
| 2007/0054467 A1 | 3/2007 | Currie et al. |
| 2007/0099315 A1 | 5/2007 | Maa et al. |
| 2007/0099329 A1 | 5/2007 | Maa et al. |
| 2007/0102721 A1 | 5/2007 | DenBaars et al. |
| 2007/0105256 A1 | 5/2007 | Fitzgerald |
| 2007/0105274 A1 | 5/2007 | Fitzgerald |
| 2007/0105335 A1 | 5/2007 | Fitzgerald |
| 2007/0181977 A1 | 8/2007 | Lochtefeld et al. |
| 2007/0187668 A1 | 8/2007 | Noguchi et al. |
| 2007/0187796 A1 | 8/2007 | Rafferty et al. |
| 2007/0196987 A1 | 8/2007 | Chidambarrao et al. |
| 2007/0248132 A1 | 10/2007 | Kikuchi et al. |
| 2007/0267722 A1 | 11/2007 | Lochtefeld et al. |
| 2008/0001169 A1 | 1/2008 | Lochtefeld |
| 2008/0070355 A1 | 3/2008 | Lochtefeld et al. |
| 2008/0073641 A1 | 3/2008 | Cheng et al. |
| 2008/0073667 A1 | 3/2008 | Lochtefeld |
| 2008/0093622 A1 | 4/2008 | Li et al. |
| 2008/0154197 A1 | 6/2008 | Derrico et al. |
| 2008/0187018 A1 | 8/2008 | Li |
| 2008/0245400 A1 | 10/2008 | Li |
| 2008/0257409 A1 | 10/2008 | Li et al. |
| 2008/0286957 A1 | 11/2008 | Lee et al. |
| 2009/0039361 A1 | 2/2009 | Li et al. |
| 2009/0042344 A1 | 2/2009 | Ye et al. |
| 2009/0065047 A1 | 3/2009 | Fiorenza et al. |
| 2009/0072284 A1 | 3/2009 | King et al. |
| 2009/0321882 A1 | 12/2009 | Park |
| 2010/0012976 A1 | 1/2010 | Hydrick et al. |
| 2010/0025683 A1 | 2/2010 | Cheng |
| 2010/0078680 A1 | 4/2010 | Cheng et al. |
| 2010/0176371 A1 | 7/2010 | Lochtefeld |
| 2010/0176375 A1 | 7/2010 | Lochtefeld |
| 2010/0213511 A1 | 8/2010 | Lochtefeld |
| 2010/0216277 A1 | 8/2010 | Fiorenza et al. |
| 2010/0252861 A1 | 10/2010 | Emerson et al. |
| 2010/0308376 A1 | 12/2010 | Takada et al. |
| 2011/0011438 A1 | 1/2011 | Li |
| 2011/0049568 A1 | 3/2011 | Lochtefeld et al. |
| 2011/0086498 A1 | 4/2011 | Cheng et al. |

FOREIGN PATENT DOCUMENTS

| | | |
|---|---|---|
| DE | 10320160 | 8/2004 |
| EP | 0352472 | 6/1989 |
| EP | 0600276 | 6/1994 |
| EP | 0817096 | 1/1998 |
| EP | 1551063 | 7/2005 |
| EP | 1796180 | 6/2007 |
| GB | 2215514 | 9/1989 |
| JP | 2-62090 | 3/1990 |
| JP | 7230952 | 8/1995 |
| JP | 10126010 | 5/1998 |
| JP | 10284436 | 10/1998 |
| JP | 10284507 | 10/1998 |
| JP | 11251684 | 9/1999 |
| JP | 11307866 | 11/1999 |
| JP | 2000021789 | 1/2000 |
| JP | 2000216432 | 8/2000 |
| JP | 2000286449 | 10/2000 |
| JP | 2000299532 | 10/2000 |
| JP | 2001007447 | 1/2001 |
| JP | 2001102678 | 4/2001 |
| JP | 3202223 | 8/2001 |
| JP | 2001257351 | 9/2001 |

(56) References Cited

FOREIGN PATENT DOCUMENTS

| | | |
|---|---|---|
| JP | 2002118255 | 4/2002 |
| JP | 2002141553 | 5/2002 |
| JP | 2002241192 | 8/2002 |
| JP | 2002293698 | 10/2002 |
| JP | 2003163370 | 6/2003 |
| JP | 3515974 | 4/2004 |
| JP | 2004200375 | 7/2004 |
| JP | 2009177167 A | 8/2009 |
| KR | 20030065631 | 8/2003 |
| KR | 20090010284 | 1/2009 |
| TW | 544930 | 8/2003 |
| WO | WO200072383 | 11/2000 |
| WO | WO2001001465 | 1/2001 |
| WO | WO2002009187 | 1/2002 |
| WO | WO2002086952 | 10/2002 |
| WO | WO2002088834 | 11/2002 |
| WO | WO2003073517 | 9/2003 |
| WO | WO2004004927 | 1/2004 |
| WO | WO2004023536 | 3/2004 |
| WO | WO2005013375 | 2/2005 |
| WO | WO2005048330 | 5/2005 |
| WO | WO2005098963 | 10/2005 |
| WO | WO2005122267 | 12/2005 |
| WO | WO2006025407 | 3/2006 |
| WO | WO2006125040 | 11/2006 |
| WO | WO 2008/124154 A2 | 10/2008 |

OTHER PUBLICATIONS

"Communication pursuant to Article 94(3) EPC," Application No. 06 770 525.1-2203, Applicant: Taiwan Semiconductor Company, Ltd., Feb. 17, 2011, 4 pages.
68 Applied Physics Letters 7, 1999, pp. 774-779 (trans. of relevant portions attached).
Ames, "Intel Says More Efficient Chips are Coming," PC World, available at: http://www.pcworld.com/printable/article/id,126044/printable.html (Jun. 12, 2006); 4 pages.
Asano et al., "AlGaInN laser diodes grown on an ELO-GaN substrate vs. on a sapphire substrate," Semiconductor Laser Conference (2000) Conference Digest, IEEE 17$^{th}$ International, 2000, pp. 109-110.
Asaoka, et al.,"Observation of 1 f ¥ noise of GaInP/GaAs triple barrier resonant tunneling diodes," AIP Conf. Proc., vol. 780, Issue 1, 2005, pp. 492-495.
Ashby, et al., "Low-dislocation-density GaN from a single growth on a textured substrate," Applied Physics Letters, vol. 77, No. 20, Nov. 13, 2000, pp. 3233-3235.
Ashley, et al., "Heternogeneous InSb Quantum Well Transistors on Silicon for Ultra-High Speed, Low Power Logic Applications," 43 Electronics Letters 14, Jul. 2007, 2 pages.
Bai et al., "Study of the Defect Elimination Mechanisms in Aspect Ratio Trapping Ge Growth," Applied Physics Letters, vol. 90, 2007, 3 pages.
Bakkers et al., "Epitaxial Growth on InP Nanowires on Germanium," Nature Materials, vol. 3, Nov. 2004, pp. 769-773.
Baron et al., "Chemical Vapor Deposition of Ge Nanocrystals on $SiO_2$," Applied Physics Letters, vol. 83, No. 7, Aug. 18, 2003, pp. 1444-1446.
Bean et al., "$Ge_xSi_{1-x}$/Si strained-later Superlattice grown by molecular beam Epitaxy," Journal of Vacuum Science Technology A2 (2), Jun. 1984, pp. 436-440.
Beckett et al., "Towards a reconfigurable nanocomputer platform," ACM International Conference Proceeding Series, vol. 19, 2002, pp. 141-150.
Beltz et al., "A Theoretical Model for Threading Dislocation Reduction During Selective Area Growth," Materials Science and Engineering, A234-236, 1997, pp. 794-797.
Belyaev, et al., "Resonance and current instabilities in AlN/GaN resonant tunneling diodes," 21 Physica E 2-4, 2004, pp. 752-755.
Berg. J., "Electrical Characterization of Silicon Nanogaps," Doktorsavhandlingar vid Chalmers Tekniska Hagskola, 2005, No. 2355, 2 pages.
Bergman et al., "RTD/CMOS Nanoelectronic Circuits: Thin-Film InP-based Resonant Tunneling Diodes Integrated with CMOS circuits," 20 Electron Device Letters 3, 1999, pp. 119-122.
Blakeslee, "The Use of Superlattices to Block the Propagation of Dislocations in Semiconductors," Mat. Res. Soc. Symposium Proceedings 148, 1989, pp. 217-227.
Bogumilowicz et al., "Chemical Vapour Etching of Si, SiGe and Ge with HCL: Applications to the Formation of Thin Relaxed SiGe Buffers and to the Revelation of Threading Dislocations," 20 Semicond. Sci. Tech. 2005, pp. 127-134.
Borland, "Novel Device structures by selective epitaxial growth (SEG)," Electron Devices Meeting, vol. 33, 1987, pp. 12-15.
Bryskiewicz, "Dislocation filtering in SiGe and InGaAs buffer layers grown by selective lateral overgrowth method," Applied Physics Letters, vol. 66, No. 10, Mar. 6, 1995, pp. 1237-1239.
Burenkov et al., "Corner Effect in Double and Triple Gate FinFETs" European solid-state device research, 33rd Conference on Essderc '03 Sep. 16-18, 2003, Piscataway, NJ, USA IEEE, vol. 16, pp. 135-138, XPo10676716.
Bushroa et al., "Lateral epitaxial overgrowth and reduction in defect density of 3C-SiC on patterned Si substrates," Journal of Crystal Growth, vol. 271, No. 1-2, Oct. 15, 2004, pp, 200-206.
Calado, et al., "Modeling of a resonant tunneling diode optical modulator," University of Algarve, Department of Electronics and Electrical Engineering, 2005, pp. 96-99.
Campo et al., "Comparison of Etching Processes of Silicon and Germanium in SF6-O2 Radio-Frequency Plasma," 13 Journal of Vac. Sci. Tech., B-2, 1995, pp. 235-241.
Cannon et al., "Monolithic Si-based Technology for Optical Receiver Circuits," Proceedings of SPIE, vol. 4999, 2003, pp. 145-155.
Chan et al., "Influence of Metalorganic Sources on the Composition Uniformity of Selectively Grown $Ga_xIn_{1-x}P$," Japan. Journal of Applied Phyiscs, vol. 33, 1994, pp. 4812-4819.
Chang et al. "3-D simulation of strained Si/SiGe heterojunction FinFETs" Semiconductor Device Research Symposium, Dec. 10-12, 2003, pp. 176-177.
Chang et al., "Effect of growth temperature on epitaxial lateral overgrowth of GaAs on Si substrate," Journal of Crystal Growth, vol. 174, No. 1-4, Apr. 1997, pp. 630-634.
Chang et al., "Epitaxial Lateral Overgrowth of Wide Dislocation-Free GaAs on Si Substrates," Electrochemical Society Proceedings, vol. 97-21, May 13, 1998, pp. 196-200.
Chau et al., 37 Opportunities and Challenges of III-V Nanoelectronics for Future High-Speed, Low Power Logic Applications, IEEE CSIC Digest, 2005, pp. 17-20.
Chen et al., "Dislocation reduction in GaN thin films via lateral overgrowth from trenches," Applied Physics Letters, vol. 75, No. 14, Oct. 4 1999, pp. 2062-2063.
Chengrong, et al., "DBRTD with a high PVCR and a peak current density at room temperature," Chinese Journal of Semiconductors vol. 26, No. 10, Oct. 2005, pp. 1871-1874.
Choi et al., "Monolithic Integration of GaAs/AlGaAs LED and Si Driver Circuit," 9 Electron Device Letters 10, Oct. 1988, 3 pages.
Choi et al., "Monolithic Integration of GaAs/AlGaAs Double-Heterostructure LEDs and Si MOSFETs," Electron Device Letters, vol. EDL-7, No. 9, Sep. 1986, 3 pages.
Choi et al., "Monolithic Integration of Si MOSFETs and GaAs MESFETs," Electron Device Letters, vol. EDL-7, No. 4, Apr. 1986, 3 pages.
Choi, et al, "Low-voltage low-power K-band balanced RTD-based MMIC VCO," 2006 IEEE, Department of EECS, Korea Advanced Institute of Science and Technology, 2006, pp. 743-746.
Cloutier et al., "Optical gain and stimulated emission in periodic nanopatterned crystalline silicon," Nature Materials, Nov. 2005, 5 pages.
Currie et al., "Carrier Mobilities and Process Stability of Strained Si n- and p-MOSFETs on SiGe Virtual Substrates," J. Vacuum Science Technology, B, vol. 19, No. 6, 2001, pp. 2268-2279.

(56) References Cited

OTHER PUBLICATIONS

Dadgar et al., "MOVPE growth of GaN on Si (111) substrates," Journal of Crystal Growth, vol. 248, Feb. 1, 2003, pp. 556-562.
Datta et al., "Silicon and III-V Nanoelectronics," IEEE International Conference on Indium Phosphide & Related Materials, 2005, pp. 7-8.
Datta et al., "Ultrahigh-Speed 0.5 V Supply Voltage In0.7Ga0.3As Quantum-Well Transistors on Silicon Substrate," 28 Electron Device Letters 8, 2007, pp. 685-687.
Davis et al., "Lateral epitaxial overgrowth of and defect reduction in GaN thin films," Lasers and Electro-Optics Society Annual Meeting (1998) LEOS '98. IEEE, vol. 1, Dec. 1-4, 1998, pp. 360-361.
De Boeck et al, "The fabrication on a novel composite GaAs/SiO$_2$ nucleation layer on silicon for heteroepitaxial overgrowth by molecular beam Epitaxy," Material Science and Engineering, B9, 1991, pp. 137-141.
Donaton et al., "Design and Fabrication of MOSFETs with a Reverse Embedded SiGe (Rev. e-SiGe) Structure," 2006 IEDM, pp. 465-468.
Dong, Y., et al, "Selective area growth of InP through narrow openings by MOCVD and its application to InP HBT," 2003 International Conference on Indium Phosphide and Related Materials, May 12-16, 2003, pp. 389-392.
European Patent Office, Extended European Search Report and Search Opinion dated Jan. 26, 2011 in EP Patent Application No. 10003084.0-2203 (9 pages).
Examination Report in European Patent Application No. 06800414.2, dated Mar. 5, 2009, 3 pages.
Fang et al., "Electrically pumped hybrid AlGaInAs-silicon evanescent laser," 14 Optics Express 20, 2006, pp. 9203-9210.
Feltin et al., "Epitaxial lateral overgrowth of GaN on Si (111)," Journal of Applied Physics, vol. 93, No. 1, Jan. 1, 2003, pp. 182-185.
Feng et al., "Integration of Germanium-on Insulator and Silicon Substrate," 27 Electron Device Letters 11, 2006, pp. 911-913.
Fiorenza et al., "Film Thickness Constraints for Manufacturable Strained Silicon CMOS," 19 Semiconductor Science Technology, 2004, p. L4.
Fischer et al., "Elastic stress relaxation in SiGe epilayers on patterned Si substrates," 75 Journal of Applied Physics 1, 1994, pp. 657-659.
Fischer et al., "State of stress and critical thickness of Strained small-area SiGe layers," Phys. Stat. Sol. (a) vol. 171, 1999, pp. 475-485.
Fitzgerald et al., "Elimination of Dislocations in Heteroepitaxial MBE and RTCVD Ge$_x$Si$_{1-x}$ Grown on Patterned Si Substrates," Journal of Electronic Materials, vol. 19, No. 9, 1990, pp. 949-955.
Fitzgerald et al., "Epitaxial Necking in GaAs Growth on Pre-patterned Si Substrates," Journal of Electronic Materials, vol. 20, No. 10, 1991, pp. 839-853.
Fitzgerald et al., "Nucleation Mechanisms and the Elimination of Misfit Dislocations at Mismatched Interfaces by Reduction in Growth Areas," Journal of Applied Physics, vol. 65, No. 6, Mar. 15, 1989, pp. 2220-2237.
Fitzgerald et al., "Structure and recombination in InGaAs/GaAs heterostructures," 63 Journal of Applied Physics, vol. 3, 1988, pp. 693-703.
Fitzgerald et al., "Totally relaxed Ge$_x$Si$_{1-x}$ layers with low threading dislocation densities grown on Si Substrates," vol. 59, Applied Physics Letters 7, 1991, pp. 811-813.
Fitzgerald, "The Effect of Substrate Growth Area on Misfit and Threading Dislocation Densities in Mismatched Heterostructures," Journal of Vacuum Science Technology, vol. 7, No. 4, Jul./Aug. 1989, pp. 782-788.
Gallagher et al., "Development of the magnetic tunnel junction MRAM at IBM: From first junctions to a 16Mb MRAM demonstrator chip", 50 IBM J. Research & Dev. 1, Jan. 2006, pp. 5-23A.
Gallas et al., "Influence of Doping on Facet Formation at the SiO$_2$/Si Interface," Surface Sci. 440, 1999, pp. 41-48.

Geppert, "Quantum transistors: toward nanoelectronics," IEEE Spectrum, Sep. 2000, pp. 46-51.
Gibbon et al., "Selective-area low-pressure MOCVD of GaInAsP and related materials on planar InP substrates," Semicond. Sci. Tech. vol. 8, 1993, pp. 998-1010.
Glew et al., "New DFB grating structure using dopant-induced refractive index step," J. Crystal Growth 261, 2004, pp. 349-354.
Golka, et al., "Negative differential resistance in dislocation-free GaN/AlGan double-barrier diodes grown on bulk GaN," 88 Applied Physics Letters 17, Apr. 2006, pp. 172106-1-172106-3.
Goodnick, S.M., "Radiation Physics and Reliability Issues in III-V Compound Semiconductor Nanoscale Heterostructure Devices," Final Technical Report, Arizona State Univ. Dept. Electrical & Compter Eng, 80 pages, 1996-1999.
Gould et al., "Magnetic resonant tunneling diodes as voltage-controlled spin selectors," 241 Phys. Stat. Sol. (B), vol. 3, 2004, pp. 700-703.
Groenert et al., "Monolithic integration of room temperature cw GaAs/AlGaAs lasers on Si substrates via relaxed graded GeSi buffer layers," 93 Journal of Applied Physics, No. 362, Jan. 2003, pp. 362-367.
Gruber, et al., "Semimagnetic Resonant Tunneling Diodes for Electron Spin Manipulation," Nanostructures: Physics & Technology, 8th International Symposium, 2000, pp. 483-486.
Gustafsson et al., "Cathodoluminescence from relaxed Ge$_x$Si$_{1-x}$ grown by heteroepitaxial lateral overgrowth," Journal of Crystal Growth 141, 1994, pp. 363-370.
Gustafsson et al., "Investigations of high quality Ge$_x$Se$_{1-x}$ grown by heteroepitaxial lateral overgrowth using cathodoluminescence," Inst. Phys. Conf. Ser., No. 134, Section 11, Apr. 1993, pp. 675-678.
Hammerschmidt, "Intel to Use Trigate Transistors from 2009 on," EETIMES Online, availabe at: http://www.eetimes.com/showArticle.jhtml?articleID=189400035 (Jun. 12, 2006). 1 page.
Hasegawa, et al., "Sensing Terahertz Signals with III-V Quantum Nanostructures," Quantum Sensing: Evolution and Revolution from Past to Future, SPIE 2003, pp. 96-105.
Hayafuji et al., Japan, Journal of Applied Physics, vol. 29, 1990, pp. 2371-2375.
Hersee et al., "The Controlled Growth of GaN Nanowires," Nano Leters, vol. 6, No. 8, 2006, pp. 1808-1811.
Hiramatsu et a., "Fabrication and characterization of low defect denisty GaN using facet-controlled epitaxial lateral overgrowth (FACELO)," Journal of Crystal Growth, vol. 221, Dec. 2000, pp. 316-326.
Hollander et al., "Strain and Misfit Dislocation Denisty in Finite Lateral Size Si$_{1-x}$Ge$_x$/Si Films Grown by Selective Epitaxy," Thin Solid Films, vol. 292, 1997, pp. 213-217.
Hu et al., "Growth of Well-Aligned Carbon Nanotube arrays on Silicon Substrates Using Porous Alumina Film as a Nanotemplate," 79 Applied Phyiscs Letters 19, 2001, 3 pages.
Yanlong, et al., "Monolithically fabricated OEICs using RTD and MSM," Chinese Journal Semiconductors vol. 27, No. 4, Apr. 2006, pp. 641-645.
Huang et al., "Electron and Hole Mobility Enhancement in Strained SOI by Wafer Bonding," 49 IEEE Transactions on Electron Devices 9, 2002, pp. 1566-1570.
Huang, et al., "Resonant tunneling diodes and high electron mobility transistors integrated on GaAs substrates," Chinese Physics Letters 23, vol. 3, Mar. 2006, pp. 697-700.
Intel Press Release, "Intel's Tri-Gate Transistor to Enable Next Era in Energy-Efficient Performance," Intel Corporation (Jun. 12, 2006). 2 pages.
Intel to Develop Tri-Gate Transistors Based Processors, available at: http://news.techwhack.com/3822/tri-gate-transistors/ (Jun. 13, 2006) 6 pages.
International Preliminary Report on Patentability for International Application No. PCT/US2006/019152 dated Nov. 29, 2007, 2 pages.
International Preliminary Report on Patentability for International Application No. PCT/US2006/029247 dated Feb. 7, 2008, 12 pages.
International Preliminary Report on Patentability for International Application No. PCT/US2006/033859 dated Mar. 20, 2008, 14 pages.

(56) References Cited

OTHER PUBLICATIONS

International Preliminary Report on Patentability for International Application No. PCT/US2007/019568 dated Mar. 19, 2009, 10 pages.
International Preliminary Report on Patentability for International Application No. PCT/US2007/020181 dated Apr. 2, 2009, 9 pages.
International Preliminary Report on Patentability for International Application No. PCT/US2007/020777 dated Apr. 9, 2009, 12 pages.
International Preliminary Report on Patentability for International Application No. PCT/US2007/021023 dated Apr. 9, 2009, 8 pages.
International Preliminary Report on Patentability for International Application No. PCT/US2007/022392 dated Apr. 30, 2009, 14 pages.
International Search Report and Written Opinion for International Application No. PCT/US2006/019152 dated Oct. 19, 2006, 11 pages.
International Search Report and Written Opinion for International Application No. PCT/US2006/029247 dated May 7, 2007, 19 pages.
International Search Report and Written Opinion for International Application No. PCT/US2008/068377, dated Jul. 6, 2009, 19 pages.
International Search Report and Written Opinion for International Application No. PCT/US2006/033859 dated Sep. 12, 2007, 22 pages.
International Search Report and Written Opinion for International Application No. PCT/US2007/007373, dated Oct. 5, 2007, 13 pages.
International Search Report and Written Opinion for International Application No. PCT/US2007/019568 dated Feb. 6, 2008, 13 pages.
International Search Report and Written Opinion for International Application No. PCT/US2007/020181 dated Jan. 25, 2008, 15 pages.
International Search Report and Written Opinion for International Application No. PCT/US2007/020777 dated Feb. 8, 2008, 18 pages.
International Search Report and Written Opinion for International Application No. PCT/US2007/021023 dated Jun. 6, 2008, 10 pages.
International Search Report and Written Opinion for International Application No. PCT/US2007/022392 dated Apr. 11, 2008, 20 pages.
International Search Report and Written Opinion for International Application No. PCT/US2006/019152, dated May 17, 2005. 11 pages.
International Technology Roadmap for Semiconductors—Front End Processes, pp. 1-62 (2005).
Ipri et al., "MONO/POLY technology for fabricating low-capacitance CMOS integrated circuits," Electron Devices, IEEE Transactions, vol. 35, No. 8, Aug. 1988 pp. 1382-1383.
Ishibashi, et al., "3rd Topical Workshop on Heterostructure Microelectronics for Information Systems Applications," Aug.-Sep. 1998, 115 pages.
Ishitani et al., "Facet Formation in Selective Silicon Epitaxial Growth," 24 Japan, Journal of Applied Physics, vol. 10, 1985, pp. 1267-1269.
Ismail et al., "High-quality GaAs on Sawtooth-patterned Si Substrates," 59 Applied Physics Letters 19, 1991, pp. 2418-2420.
Jain et al., "Stresses in strained GeSi stripes and quantum structures: calculation using the finite element method and determination using micro-Raman and other measurements," Thin Solid Films 292, 1997, pp. 218-226.
Jeong, et al., "Performance improvement of InP-based differential HBT VCO using the resonant tunneling diode," 2006 International Conf. on Indium Phosphide and Related Mat. Conf. Proc., pp. 42-45.
Ju et al., "Epitaxial lateral overgrowth of gallium nitride on silicon substrate," Journal of Crystal Growth, vol. 263, No. 1-4, Mar. 1, 2004, pp. 30-34.
Kamins et al., "Kinetics of Selective Epitaxial Depostion of Si1-xGex," Hewlett-Packard Company, Palo Alto, CA, Appl. Phys. Lett. 61 (6), Aug. 10, 1992 (pp. 669-671).
Kamiyama, et al., "UV laser diode with 350.9-nm-lasing wavelength grown by hetero-epitaxial-lateral overgrowth technology," Selected Topics in Quantum Electronics, IEEE Journal of Selected Topics in Quantum Electronics, vol. 11, No. 5, Sep.-Oct. 2005, pp. 1069-1073.
Kamiyama, et al., "UV light-emitting diode fabricated on hetero-ELO-grown $Al_{0.22}Ga_{0.78}N$ with low dislocation density," Physica Status Solidi A, vol. 192, No. 2, Aug. 2002, pp. 296-300.
Kawai, et al., "Epitaxial Growth of InN Films and InN Nano-Columns by RF-MBE," The Institute of Electronics, Information and Communication Engineers, Gijutsu Kenkyu, vol. 13, No. 343 (CPM2003 102-116), 2003, pp. 33-37.
Kazi et al, "Realization of GaAs/AlGaAs Lasers on Si Substrates Using Epitaxial Lateral Overgrowth by Metalorganic Chemical Vapor Deposition," Japan, Journal of Applied Physics, vol. 40, 2001, pp. 4903-4906.
Kidoguchi et al., "Air-bridged lateral epitaxial overgrowth of GaN thin Films," Applied Physics Letters, vol. 76, No. 25, Jun. 19, 2000, pp. 3768-3770.
Kim et al., "Silicon-Based Field-Induced Band-to-Band Tunneling Effect Transistor," IEEE Electron Device Letters, No. 25, No. 6, 2004, pp. 439-441.
Kim et al., "GaN nano epitaxial lateral overgrowth on holographically patterned substrates," School of Physics and Inter-University Semiconductor Research Center, Seoul National University, Aug. 25-27, 2003, pp. 27-28.
Kimura et al., "Vibronic Fine Structure Found in the Blue Luminescence from Silicon Nanocolloids," Japan, Journal of Applied Physics, vol. 38, 1999, pp. 609-612.
Klapper, "Generation and Propagation of Dislocations During Crystal Growth," Mat. Chem. and Phys. vol. 66, 2000, pp. 101-109.
Knall et al., "Threading Dislocations in GaAs Grown with Free Sidewalls on Si mesas," Journal of Vac. Sci. Technol. B, vol. 12, No. 6, Nov./Dec. 1994, pp. 3069-3074.
Kollonitsch, et al., "Improved Structure and Performance of the GaAsSb/InP Interface in a Resonant Tunneling Diode," Journal of Crystal Growth, vol. 287, 2006, pp. 536-540.
Krishnamurthy, et al., "I-V characteristics in resonant tunneling devices: Difference Equation Method," Journal of Applied Physics, vol. 84, Issue 9, Condensed Matter: Elecrical and Magnetic Properties (PACS 71-76), 1998, 9 pages.
Krost et al., "GaN-based Optoelectronics on Silicon Substrates," Materials Science & Engineering, B93, 2002, pp. 77-84.
Sudingo et al., "Si-Based Resonant Interband Tunnel Diode/CMOS Integrated Memory Circuits," Rochester Institute of Technology, 2006, pp. 1-48.
Kusakabe, K. et al., Characterization of Overgrown GaN layers on Nano-Columns Grown by RF-Molecular Beam Epitaxy, Japan, Journal of Applied Physics, Part 2, vol. 40, No. 3A, 2001, pp. L192-L194.
Kushida et al., "Epitaxial growth of $PbTiO_3$ films on $SrTiO_3$ by RF magnetron sputtering," Ultrasonics, Ferroelectrics and Frequency Control, IEEE Transactions on Ultrasonics Ferroelectrics and Frequency Control, vol. 38, No. 6, Nov. 1991, pp. 656-662.
Kwok, "Barrier-Injection Transit Time Diode," Complete Guide to Semiconductor Devices, $2^{nd}$ ed., Chapter 18, 2002, pp. 137-144.
Lammers, "Trigate and High-k stack up vs. planar," EETIMES Online, available at: http://www.eetimes.com/showArticle.jhtml?articleID=188703323&pgno=2&printable=true (Jun. 12, 2006). 2 pages.
Langdo et al., "High Quality Ge on Si by Epitaxial Necking," Applied Physics Letters, vol. 76, No. 25, Jun. 19, 2000, pp. 3700-3702.
Langdo, "Selective SiGe Nanostructures," PhD Thesis, Massachusetts Institute of Technology, Jun. 2001, 215 pages.
Lee et al., "Growth of GaN on a nanoscale periodic faceted Si substrate by metal organic vapor phase epitaxy," Compound Semiconductors: Post-Conference Proceedings, Aug. 25-27, 2003, pp. 15-21.
Lee et al., "Strain-relieved, Dislocation-free $In_xGa_{1-x}As/GaAs(001)$ Heterostructure by Nanoscale-patterned Growth," Applied Physics Letters, vol. 85, No. 18, Nov. 1, 2004, pp. 4181-4183.
Li et al., "Defect Reduction of GasAs Epitaxy on Si (001) Using Selective Aspect Ratio Trapping," 91 Applied Physics Letters, 2007, pp. 021114-1-021114-3.

(56) References Cited

OTHER PUBLICATIONS

Li et al., "Heteroepitaxy of High-quality Ge on Si by Nanoscale Ge seeds Grown through a Thin Layer of $SiO_2$," Applied Physics Letters, vol. 85, No. 11, Sep. 13, 2004, pp. 1928-1930.
Li et al., "Morphological Evolution and Strain Relaxation of Ge Islands Grown on Chemically Oxidized Si (100) by Molecular-Beam Epitaxy," Journal of Applied Physics, vol. 98, 2005, pp. 073504-1-073504-8.
Li et al., "Selective Growth of Ge on Si (100) through Vias of $Si_{02}$ Nanotemplate Using Solid Source Molecular Beam Epitaxy," Applied Physics Letters, vol. 83, No. 24, Dec. 15, 2003, pp. 5032-5034.
Liang et al., "Critical Thickness enhancement of Epitaxial SiGe films Grown on Small Structures," Journal of Applied Physics, vol. 97, 2005, pp. 043519-1-043519-7.
Lim et al., "Facet Evolution in Selective Epitaxial Growth of Si by cold-wall ultrahigh vacuum chemical vapor deposition," Journal of Vac. Sci. Tech., vol. B 22, No. 2, 2004, pp. 682.
Liu et al., "High Quality Single-crystal Ge on Insulator by Liquid-phase Epitaxy on Si Substrates," Applied Physics Letters, vol. 84, No. 14, Apr. 4, 2004, pp. 2563-2565.
Liu et al., "Rapid Melt Growth of Germanium Crystals with Self Aligned Microcrucibles on Si Substrates," Journal of the Electrochemical Society, vol. 152, No. 8, 2005, pp. G688-G693.
Loo et al., "Successful Selective Epitaxial $Si_{1-x}Ge_x$ Deposition Process for HBT-BiCMOS and High Mobility Heterojunction pMOS Applications," 150 Journal of Electrochemical Society 10, 2003, pp. G638-G647.
Lourdudoss et al., "Semi-insulating epitaxial layers for optoelectronic devices," Semiconducting and Insulating Materials Conference, SIMC-XI, 2000, pp. 171-178.
Luan et al., "High-quality Ge Epilayers on Si with Low Threading-dislocation Densities," Applied Physics Letters, vol. 75, No. 19, Nov. 8, 1999, pp. 2909-2911.
Luan, "Ge Photodetectors for Si Microphotonics," PhD Thesis, Massachusetts Institute of Technology, Department of Materials Science & Engineering, Jan. 12, 2001, 155 pages.
Lubnow et al., "Effect of III/V-Compound Epitaxy on Si Metal-Oxide-Semiconductor Circuits," Japan, Journal of Applied Physics, vol. 33, 1994, pp. 3628-3634.
Luo et al., Enhancement of (IN,Ga)N Light-Emitting Diode Performance by Laser Liftoff and Transfer From Sapphire to Silicon, IEEE Photonics Technology Letters, vol. 14, No. 10, 2002, pp. 1400-1402.
Luryi et al., "New Approach to the High Quality Epitaxial Growth of Latticed-Mismatched Materials," Applied Physics Letters, vol. 49, No. 3, Jul. 2, 1986, pp. 140-142.
Ma, et al., "A small signal equivalent circuit model for resonant tunneling diode," Chinese Physics Letters, vol. 23, No. 8, Aug. 2006, pp. 2292-2295.
Ma, et al., "Fabrication of an AlAs/In0.53/Ga0.47/As/InAs resonant tunneling diode on InP substrate for high-speed circuit applications," 27 Chinese J. Semiconductors 6, Jun. 2006, pp. 959-962.
Maekawa, et al., "High PVCR Si/Si1-x/Gex DW RTD formed with a new triple-layer buffer," Materials Science in Semiconductor Processing, vol. 8, 2005, pp. 417-421.
Maezawa, et al., "Metamorphic resonant tunneling diodes and its application to chaos generator ICs," 44 Jap. J. Applied Physics, Part 1, No. 7A, Jul. 2005, pp. 4790-4794.
Maezawa, et al., "InP-based resonant tunneling diode/HEMT integrated circuits for ultrahigh-speed operation," IEEE Nagoya University, Institute for Advanced Research, 2006, pp. 252-257.
Martinez et al., "Characterization of GaAs Conformal Layers Grown by Hydride Vapour Phase Epitaxy on Si Substrates by Microphotoluminescence Cathodoluminescence and MicroRaman," Journal of Crystal Growth, vol. 210, 2000, pp. 198-202.
Matsunaga et al., "A New Way to Achieve Dislocation-Free Heteroepitaxial Growth by Molecular Beam Epitaxy: Vertical Microchannel Epitaxy," Journal of Crystal Growth, vol. 237-239, 2002, pp. 1460-1465.

Matthews et al., "Defects in Epitaxial Multilayers—Misfit Dislocations," Journal of Crystal Growth, vol. 27, 1974, pp. 118-125.
Monroy, et al., "High UV/visible Contrast Photodiodes Based on Epitaxial Lateral Overgrown GaN layers," Electronics Letters, vol. 35, No. 17, Aug. 19, 1999, pp. 1488-1489.
Nakano et al., "Epitaxial Lateral Overgrowth of AlN Layers on Patterned Sapphire Substrates," Source: Physica Status Solidi A, vol. 203, No. 7, May 2006, pp. 1632-1635.
Nam et al., "Lateral Epitaxy of Low Defect Density GaN Layers via Organometallic Vapor Phase Epitaxy," Applied Physics Letters, vol. 71, No. 18, Nov. 3, 1997, pp. 2638-2640.
Naoi et al., "Epitaxial Lateral Overgrowth of GaN on Selected-area Si (111) Substrate with Nitrided Si Mask," Journal of Crystal Growth, vol. 248, 2003, pp. 573-577.
Naritsuka et al., "InP Layer Grown on (001) Silicon Substrate by Epitaxial Lateral Overgrowth," Japan, Journal of Applied Physics, vol. 34, 1995, pp. L1432-L1435.
Naritsuka et al., "Vertical Cavity Surface Emitting Laser Fabricated on GaAs Laterally Grown on Si Substrate," Electrochemical Society Proceedings, vol. 97, No. 21, pp. 86-90.
Neudeck, et al., "Novel silicon Epitaxy for advanced MOSFET devices," Electron Devices Meeting, IEDM Technical Digest International, 2000, pp. 169-172.
Neumann et al., "Growth of III-V Resonant Tunneling Diode on Si Substrate with LP-MOVPE," Journal of Crystal Growth, vol. 248, 2003, pp. 380-383.
Noborisaka, J., et al., "Catalyst-free growth of GaAs nanowires by selective-area metalorganic vapor-phase epitaxy," Applied Physics Letters, vol. 86, May 16, 2005, pp. 213102-1-213102-3.
Noborisaka, J., et al., "Fabrication and characterization of freestanding GaAs/AlGaAs core-shell nanowires and AlGaAs nanotubes by suing selective-area metalorganic vapor phase epitaxy," Applied Physics Letters, vol. 87, Aug. 24, 2005, pp. 093109-1-093109-3.
Noda, et al., "Current-voltage characteristics in double-barrier resonant tunneling diodes with embedded GaAs quantum rings," Physica E 32, 2006, pp. 550-553.
Norman, et al., "Characterization of MOCVD Lateral Epitaxial Overgrown III-V Semiconductor Layers on GaAs Substrates," Compound Semiconductors, Aug. 25-27, 2003, pp. 45-46.
Notification of International Searh Report and the Written Opinion of the International Search Authority for PCT/US2010/029552, Applicant: Taiwan Semiconductor Manufacturing Company, Ltd., May 26, 2010, 15 pages.
Oehrlein et al., "Studies of the Reactive Ion Etching of SiGe Alloys," J. Vac. Sci. Tech, A9, No. 3, May/Jun. 1991, pp. 768-774.
Orihashi, et al., "Experimental and theoretical characteristics of sub-terahertz and terahertz oscillations of resonant tunneling diodes integrated with slot antennas," 44 Jap. J. Applied Physics, Part 1, No. 11, Nov. 2005, pp. 7809-7815.
Parillaud et al., "High Quality InP on Si by Conformal Growth," Applied Physics Letters, vol. 68, No. 19, May 6, 1996, pp. 2654-2656.
Park et al., "Defect Reduction and its Mechanism of Selective Ge Epitaxy in Trenches on Si(001) Substrate Using Aspect Ratio Trapping," Mat. Res. Society Symp. Proc., vol. 994, 2007, 6 pages.
Park et al., "Defect Reduction of Selective Ge Epitaxy in Trenches on Si (001) Substrates Using Aspect Ratio Trapping," Applied Physics Letters 90, 052113, Feb. 2, 2007, 3 pages.
Park et al., "Growth of Ge Thick Layers on Si (001) Substrates Using Reduced Pressure Chemical Vapor Deposition," 45 Japan, Journal of Applied Physics, vol. 11, 2006, pp. 8581-8585.
Partial International Search for International Application No. PCT/US2006/033859 dated Jun. 22, 2007, 7 pages.
Partial International Search Report for International Application No. PCT/US2008/004564 completed Jul. 22, 2009, dated Oct. 16, 2009, 5 pages.
Partial International Search Report for International Application No. PCT/US2008/068377, completed Mar. 19, 2008, dated Apr. 22, 2008, 3 pages.
PCT International Search Report of PCT/US2009/057493, from PCT/ISA/210, dated Mar. 22, 2010, Applicant: Amberwave System Corporation et al., 2 pages.

(56) References Cited

OTHER PUBLICATIONS

Pidin et al., "MOSFET Current Drive Optimization Using Silicon Nitride Capping Layer for 65-nm Technology Node," Symposium on VLSI Technology, Dig. Tech. Papers, 2004, pp. 54-55.
Piffault et al., "Assessment of the Strain of InP Films on Si Obtained by HVPE Conformal Growth," Indium Phosphide and Related Materials, Conference Proceedings, Sixth International Conference on Mar. 27-31, 1994, pp. 155-158.
Pribat et al., "High Quality GaAs on Si by Conformal Growth," Applied Physics Letters, vol. 60, No. 17, Apr. 27, 1992, pp. 2144-2146.
Prost, ed. "QUDOS Technical Report," 2002-2004, 77 pages.
Prost, et al., "High-speed InP-based resonant tunneling diode on silicon substrate," Proceedings of the 31st European Solid-State Device Research Conf., 2005, pp. 257-260.
Radulovic, et al., "Transient Quantum Drift-Diffusion Modelling of Resonant Tunneling Heterostructure Nanodevices," Physics of Semiconductors: $27^{th}$ International Conference on the Physics of Semiconductors—ICPS-27, Jun. 2005 AIP Conf. Proc., pp. 1485-1486.
Reed et al., "Realization of a Three-Terminal Resonant Tunneling Device: The Bipolar Quantum Resonant Tunneling Transistor," 54 Applied Physics Letters 11, 1989, p. 1034.
Ren et al., "Low-dislocation-density, Nonplanar GaN Templates for Buried Heterostructure Lasers Grown by Lateral Epitaxial Overgrowth," Applied Physics Letters, vol. 86, No. 11, Mar. 14, 2005, pp. 111901-1-111901-3.
Rim et al., "Enhanced Hole Mobilities in Surface-Channel Strained-Si p-MOSFETs," 1995 IEDM, pp. 517-520.
Rim et al., "Fabrication and Mobility Characteristics of Ultra-thin Strained Si Directly on Insulator (SSDOI) MOSFETs," IEDM Tech. Dig., 2003, pp. 49-52.
Ringel et al., "Single-junction InGaP/GaAs Solar Cells Grown on Si Substrates with SiGe Buffer Layers," Prog. Photovolt., Res. & Applied, vol. 10, 2002, pp. 417-426.
Rosenblad et al., "A Plasma Process for Ultrafast Deposition of SiGe Graded Buffer Layers," 76 Applied Physics Letters 4, 2000, pp. 427-429.
Sakai, "Defect Structure in Selectively Grown GaN Films with Low Threading Dislocation Density," Applied Physics Letters 71, vol. 16, 1997, pp. 2259-2261.
Sakai, "Transmission Electron Microscopy of Defects in GaN Films Formed by Epitaxial Lateral Overgrowth," 73 Applied Physics Letters 4, 1998, pp. 481-483.
Sakawa et al., "Effect of Si Doping on Epitaxial Lateral Overgrowth of GaAs on GaAs-Coated Si Substrate," Japan, Journal of Applied Physics, vol. 31, 1992, pp. L359-L361.
Pal, et al., "Multiple Layers of Silicon-on-Insulator Islands Fabrication by Selective Epitaxial Growth," Electron Device Letters, IEEE, vol. 20, No. 5, May 1999, pp. 194-196.
Sass, et al., "Strain in GaP/GaAs and GaAs/GaP resonant tunneling heterostructures," Journal of Crystal Growth, vol. 248, Feb. 2003, pp. 375-379.
Schaub, et al., "Resonant-Cavity-Enhanced High-Speed Si photodiode Grown by Epitaxial Lateral Overgrowth," Photonics Technology Letters, IEEE, vol. 11, No. 12, Dec. 1999, pp. 1647-1649.
Seabaugh et al., Promise of Tunnel Diode Integrated Circuits, Tunnel Diode and CMOS/HBT Integration Workshop, Naval Research Laboratory, Dec. 9, 1999, 13 pages.
Shahidi, et al., "Fabrication of CMOS on Ultrathin SOI Obtained by Epitaxial Lateral Overgrowth and Chemical-Mechanical Polishing," Electron Devices Meeting, Technical Digest, International, Dec. 9-12, 1990, pp. 587-590.
Shichijo et al., "Co-Integration of GaAs MESFET & Si CMOS Circuits," 9 Elec. Device Letters 9, Sep. 1988, pp. 444-446.
Shubert, E.F., "Resonant tunneling diode (RTD) structures," Rensselear Polytechnic Institute, 2003, pp. 1-14.
Siekkinen, et al., "Selective Epitaxial Growth Silicon Bipolar Transistors for Material Characterization," Electron Devices, IEEE Transactions on Electron Devices, vol. 35, No. 10, Oct. 1988, pp. 1640-1644.
Su et al., "Catalytic Growth of Group III-nitride Nanowires and Nanostructures by Metalorganic Chemical Vapor Deposition," Applied Physics Letters, vol. 86, 2005, pp. 013105-1-013105-3.
Su et al., "New Planar Self-Aligned Double-Gate Fully-depleted P-MOSFETs Using Epitaxial Lateral Overgrowth (ELO) and selectively grown source/drain (S/D)," 2000 IEEE Int'l SOI Conf., pp. 110-111.
Suhara, et al, "Characterization of argon fast atom beam source and its application to the fabrication of resonant tunneling diodes," 2005 International Miceoprocesses and Nanotechnology Conf. Di. of Papers, 2005, 132-133.
Sun et al., Electron resonant tunneling through InAs/GaAs quantum dots embedded in a Schottky diode with an AlAs insertion layer, 153 J. Electrochemical Society 153, 2006, pp. G703-G706.
Sun et al., "Room-temperature observation of electron resonant tunneling through InAs/AlAs quantum dots," 9 Electrochemical and Solid-State Letters 5, May 2006, pp. G167-G170.
Sun et al., "InGaAsP Multi-Quantum Wells at 1.5 /splmu/m Wavelength Grown on Indium Phosphide Templates on Silicon," Indium Phosphide and Related Materials, May 12-16, 2003, pp. 277-280.
Sun et al., "Selective Area Growth of InP on InP Precoated Silicon Substrate by Hydride Vapor Phase epitaxy," Indium Phosphide and Related Materials Conference, IPRM. $14^{th}$, 2002, pp. 339-342.
Sun et al., "Sulfur Doped Indium Phosphide on Silicon Substrate Grown by Epitaxial Lateral Overgrowth," Indium Phosphide and Related Materials $16^{th}$ IPRM, May 31-Jun. 4, 2004, pp. 334-337.
Sun et al., "Temporally Resolved Growth of InP in the Opening Off-Oriented from [110] Direction," Idium Phosphide and Related Materials, Conference Proceedings, 2000 International Conference, pp. 227-230.
Sun et al., "Thermal Strain in Indium Phosphide on Silicon Obtained by Epitaxial Lateral Overgrowth," 94 Journal of Applied Physics 4, 2003, pp. 2746-2748.
Suryanarayanan et al., "Microstructure of Lateral Epitaxial Overgrown InAs on (100) GaAs Substrates," Applied Physics Letters, vol. 83, No. 10, Sep. 8, 2003, pp. 1977-1979.
Suzuki, et al., "Mutual injection locking between sub-THz oscillating resonant tunneling diodes," Japan Science and Technology Agency, IEEE, Joint $30^{th}$ International Conference on Infrared and Millimeter Waves & $13^{th}$ International Conference on Terahertz Electronics, 2005, pp. 150-151.
Takasuka et al, "AlGaAs/InGaAs DFB Laser by One-Time Selective MOCVD Growth on a Grating Substrate," 43 Japan, Journal of Applied Physics, 4B, 2004, pp. 2019-2022.
Takasuka et al, "InGaAs/AlGaAs Quantum Wire DFB Buried HeteroStructure Laser Diode by One-Time Selective MOCVD on Ridge Substrate," 44 Japan, Journal of Applied Physics, 4B, 2005, pp. 2546-2548.
Tamura et al., "Heteroepitaxy on High-Quality GaAs on Si for Optical Interconnections on Si Chip," Proceedings of the SPIE, vol. 2400, 1995, pp. 128-139.
Tamura et al., "Threading Dislocations in GaAs on Pre-patterned Si and in Post-patterned GaAs on Si," Journal of Crystal Growth, vol. 147, 1995, pp. 264-273.
Tanaka et al., "Structural Characterization of GaN Lateral Overgrown on a (111) Si Substrate," Applied Physics Letters, vol. 79, No. 7, Aug. 13, 2001, pp. 955-957.
Thean et al., "Uniaxial-Biaxial Hybridization for Super-Critical Strained-Si Directly on Insulator (SC-SSOI) PMOS with Different Channel Orientations," IEEE, 2005, pp. 1-4.
Thelander, et al., "Heterostructures incorporated in one-dimensinal semiconductor materials and devices," Physics of Semiconductors, vol. 171, 2002, 1 page. Abstract Only.
Thompson et al., "A Logic Nanotechnology Featuring Strained-Silicon," 25 IEEE Electron Device Letters 4, 2004, pp. 191-193.
Ting, et al., "Modeling Spin-Dependent Transport in InAS/GaSb/AlSb Resonant Tunneling Structures," 1 J. Computational Electronics, 2002, pp. 147-151.

(56) References Cited

OTHER PUBLICATIONS

Tomiya et al., "Dislocation Related Issues in the Degradation of GaN-Based Laser Diodes," Selected Topics in Quantum Electronics, IEEE Journal of Selected Topics in Quantum Electronics, vol. 10, No. 6, Nov./Dec. 2004, pp. 1277-1286.
Tomiya, "Dependency of crystallographic tilt and defect distribution of mask material in epitaxial lateral overgrown GaN layers," Applied Physics Letters vol. 77, No. 5, pp. 636-638.
Tran et al., "Growth and Characterization of InP on Silicon by MOCVD," Journal of Crystal Growth, vol. 121, 1992, pp. 365-372.
Tsai, et al., "InP/InGaAs resonant tunneling diode with six-route negative differential resistances," 13th European Gallium Arsenide and other Compound Semiconductors Application Symp. 2006, pp. 421-423.
Tsang et al., "The heteroepitaxial Ridge-Overgrown Distributed Feedback Laser," Quantum Electronics, IEEE Journal of Quantum Electronics, vol. 21, No. 6, Jun. 1985, pp. 519-526.
Tsaur, et al., "Low-Dislocation-Density GaAs epilayers Grown on Ge-Coated Si substrates by Means of Lateral Epitaxial Overgrowth," Applied Physics Letters, vol. 41, No. 15, Aug. 1982, pp. 347-349.
Tseng et al., "Effects of Isolation Materials on Facet Formation for Silicon Selective Epitaxial Growth," 71 Applied Physics Letters 16, 1997, pp. 2328.
Tsuji et al., Selective Epitaxial Growth of GaAs on Si with Strained Sort-period Superlattices by Molecular Beam Epitaxy under Atomic Hydrogen Irradiation, J. Vac. Sci. Technol. B, vol. 22, No. 3, May/Jun. 2004, pp. 1428-1431.
Ujiie, et al., Epitaxial Lateral Overgrowth of GaAs on a Si Substrate, 28, Japan, Journal of Applied Physics, vol. 3, Mar. 1989, pp. L337-L339.
Usuda et al., "Strain Relaxation of Strained-Si Layers on SiGe-on-Insulator (SGOI) Structures After Mesa Isolation," Applied Surface Science, vol. 224, 2004, pp. 113-116.
Usui et al., "Thick GaN Epitaxial Growth with Low Dislocation Density by Hydride Vapor Phase Epitaxy," vol. 36, Japan, Journal of Applied Physics, 1997, pp. L899-L902.
Vanamu et al., "Epitaxial Growth of High-Quality Ge Films on Nanostructured Silicon Substrates," Applied Physics Letters, vol. 88, 2006, pp. 204104.1-204-104.3.
Vanamu et al., "Growth of High Quality Ge/$Si_{1-x}Ge_x$ on Nano-scale Patterned Si Structures," J. Vac. Sci. Technology. B, vol. 23, No. 4, Jul./Aug. 2005, pp. 1622-1629.
Vanamu et al., "Heteroepitaxial Growth on Microscale Patterned Silicon Structures," Journal of Crystal Growth, vol. 280, 2005, pp. 66-74.
Vanamu et al., "Imporving Ge $Si_sGe_{1-x}$ Film Quality through Growth onto Patterned Silicon Substrates," Advances in Electronics Manufacturing Technology, Nov. 8, 2004, pp. 1-4.
Vescan et al., "Lateral Confinement by Low Pressure Chemical Vapor Deposition-Based Selective Epitaxial Growth of $Si_{1-x}Ge_x$/Si Nanostructures," No. 81, Journal of Applied Physics 10, 1997, pp. 6709-6715.
Vetury et al., "First Demonstration of AlGaN/GaN Heterostructure Field Effect Transistor on GaN Grown by Lateral Epitaxial Overgrowth (ELO)," Inst. Phys. Conf. Ser. No. 162: Ch. 5, Oct. 1998, pp. 177-183.
Walker, et al., "Magnetotunneling spectroscopy of ring-shaped (InGa)As quantum dots: Evidence of excited states with 2pz character," 32 Physica E 1-2, May 2006, pp. 57-60.
Wang et al, "Fabrication of Patterned Sapphire Substrate by Wet Chemical Etching for Maskless Lateral Overgrowth of GaN," Journal of Electrochemical Society, vol. 153, No. 3, Mar. 2006, pp. C182-C185.
Watanabe, et al., "Fluoride resonant tunneling diodes on Si substrates," IEEE International Semiconductor Device Research Symp. Dec. 2005, pp. 177-178.
Wernersson et al., "InAs Epitaxial Lateral Growth of W Marks," Journal of Crystal Growth, vol. 280, 2005, pp. 81-86.

Williams et al., "Etch Rates for Micromachining Processing—Part II," Journal of Microelectromechanical Systems, vol. 4, 1996, pp. 761-778.
Williams et al., "Etch Rates for Micromachining Processing—Part II," Journal of Microelectromechnical Systems, vol. 5, No. 4, Dec. 1996, pp. 256-269.
Wu et al., "Enhancement-mode InP n-channel metal-oxide-semiconductor field-effect-transistors with atomic-layer-deposited Al2O3 dielectrics," Applied Physics Letters 91, 022108-022110 (2007).
Wu et al., Gross-Sectional Scanning/Tunneling Microscopy Investigations of Cleaned III-V Heterostructures, Technical report, Dec. 1996, 7 pages.
Wu et al., "Inversion-type enhancement-mode InP MOSFETs with ALD Al2O3, HfAlO nanolaminates as high-k gate dielectrics," Proceedings of the 65th Device Research Conf., 2007, pp. 49-52.
Wuu et al., "Defect Reduction and Efficiency Improvement of Near-Ultraviolet Emitters via Laterally Overgrown GaN on A GaN/Patterned Sapphire Template," Applied Physics Letters, vol. 89, No. 16, Oct. 16, 2006, pp. 161105-1-161105-3.
Xie et al., "From Porous Si to Patterned Si Substrate: Can Misfit Strain Energy in a Continuous Heteroepitaxial Film Be Reduced?" Journal of Vacuum Science Technology, B, vol. 8, No. 2, Mar./Apr. 1990, pp. 227-231.
Xu et al., "Spin-Filter Devices Based on Resonant Tunneling Antisymmetrical Magnetic Semiconductor Hybrid Structures," vol. 84, Applied Physics Letters 11, 2004, pp. 1955-1957.
Yamaguchi et al., "Analysis for Dislocation Density Reduction in Selective Area Growth GaAs Films on Si Substrates," Applied Physics Letters, vol. 56, No. 1, Jan. 1, 1990, pp. 27-29.
Yamaguchi et al., "Defect Reduction Effects in GaAs on Si Substrates by Thermal Annealing," Applied Physics Letters vol. 53, No. 23, 1998, pp. 2293.
Yamaguchi et al., GaAs Solar Cells Grown on Si Substrates for Space Use: Prog. Photovolt.: Res. Appl., vol. 9, 2001; pp. 191-201.
Yamaguchi et al., "Super-High-Efficiency Multi-junction Solar Cells," Prog. Photovolt.: Res. Appl., vol. 13, 2005, pp. 125-132.
Yamamoto et al., "Optimization of InP/Si Heteroepitaxial Growth Conditions Using Organometallic Vapor Phase Epitaxy," Journal of Crystal Growth, vol. 96, 1989, pp. 369-377.
Yang et al., "High Performance CMOS Fabricated on Hybrid Substrate with Different Crystal Orientations," IEDM Tech. Dig., 2003, pp. 453-456.
Yang et al., "Selective Area Deposited Blue GaN—InGaN Multiple-quantum Well Light Emitting Diodes over Silicon Substrates," Applied Physics Letter, vol. 76, No. 3, Jan. 17, 2000, pp. 273-275.
Yili, et al., "Physics-based hydrodynamic simulation of direct current characteristics in DBRTD," 29 Chinese J. Electron Devices 2, Jun. 2006, pp. 365-368.
Yin et al., "Ultrathin Strained-SOI by Stress Balance on Compliant Substrates and FET Performance," 52 IEEE Trans. on Electron Devices 10, 2005, pp. 2207-2214.
Yingda, et al., "Selective area growth of InP through narrow openings by MOCVD and its application to inP HBT," Indium Phosphide and Related Materials, International Conference, May 12-16, 2003, pp. 389-392.
Yoon et al., "Selective Growth of Ge Islands on Nanometer-scale Patterned $SiO_2$/Si Substrate by Molecular Beam Epitaxy," Applied Physics Letters, vol. 89, 2006, pp. 063107.1-063107.3.
Yoshizawa et al., "Growth of self-Organized GaN Nanostructures on Al 2O3 (0001) by RF-Radial Source Molecular Beam Epitaxy", Japan Journal of Applied Physics, Part 2 vol. 36 No. 4B 1997 pp. L459-L462.
Zamir et al., Thermal Microcrack Distribution Control in GaN Layers on Si Substrates by Lateral Confined Epitaxy, Applied Physics Letters, vol. 78, No. 3, Jan. 15, 2001, pp. 288-290.
Zang et al., "Nanoheteroepitaxial lateral overgrowth of GaN on nanoporous Si (111)," Applied Physics Letters, vol. 88, No. 14, Apr. 3, 2006, pp. 141925.
Zang et al., "Nanoscale lateral epitaxial overgrowth of GaN on Si (111)," Applied Physics Letters, vol. 87, No. 19 (Nov. 7, 2005) pp. 193106.1-193106.3.

(56) References Cited

OTHER PUBLICATIONS

Zela et al., "Single-crystalline Ge Grown Epitaxially on Oxidized and Reduced Ge/Si (100) Islands," Journal of Crystal Growth, vol. 263, 2004, pp. 90-93.

Zhang et al., "Removal of Threading Dislocations from Patterned Heteroepitaxial Semiconductors by Glide to Sidewalls," Journal of Electronic Materials, vol. 27, No. 11, 1998, pp. 1248-1253.

Zhang et al., "Strain Status of Self-Assembled InAs Quantum Dots," Applied Physics Letters, vol. 77, No. 9, Aug. 28, 2000, pp. 1295-1297.

Zheleva et al., "Lateral Epitaxy and Dislocation Density Reduction in Selectively Grown GaN Structures," Journal of Crystal Growth, vol. 222, No. 4, Feb. 4, 2001, pp. 706-718.

Zubia et al., "Initial Nanoheteroepitaxial Growth of GaAs on Si (100) by OMVPE," Journal of Electronic Materials, vol. 30, No. 1, 2001, pp. 812-816.

Hydrick et al., "Chemical Mechanical Polishing of Epitaxial Germanium on $SiO^2$-patterned Si(001) Substrates," ECS Transactions, 16 (10) 2008, (pp. 237-248).

Li et al, "Monolithic Integration of GaAs/InGaAs Lasers on Virtual Ge Substrates via Aspect-Ratio Trapping," Journal of The Electrochemical Society, 156 (7), 2009, (pp. H574-H578).

Park et al., "Fabrication of Low-Defectivity, Compressively Strained Geon $Si_{0.2}G^e{}_{0.8}$ Structures Using Aspect Ratio Trapping" Journal of The Electrochemical Society, 156 (4) 2009, (pp. H249-H254).

US 9,984,872 B2

FABRICATION AND STRUCTURES OF CRYSTALLINE MATERIAL

CROSS-REFERENCE TO RELATED APPLICATIONS

The present application is a divisional of U.S. application Ser. No. 12/562,206, filed Sep. 18, 2009 entitled "FABRICATION AND STRUCTURES OF CRYSTALLINE MATERIAL," which claims priority from U.S. Provisional Application No. 61/098,734, filed Sep. 19, 2008, entitled "IMPROVED FABRICATION AND STRUCTURES OF CRYSTALLINE MATERIAL" which applications are hereby incorporated by reference herein.

BACKGROUND OF THE INVENTION

1. Field of the Invention

The present invention relates to fabrication or structures including a semiconductor crystalline material. For example, improved epitaxial growth or structures may occur over a planarized surface including a semiconductor crystalline material.

2. Description of the Related Art

This section provides background information and introduces information related to various aspects of the disclosure that are described and/or claimed below. These background statements are not admissions of prior art.

Integration of lattice-mismatched semiconductor materials is one path to high performance devices such as complementary metal-oxide-semiconductor (CMOS) field-effect transistors (FET) due to their high carrier mobility. For example, the heterointegration of lattice-mismatched semiconductor materials with silicon will be useful for a wide variety of device applications.

One heterointegration method involves replacing silicon (Si) channel with high-mobility materials for CMOS devices, for example, high-performance devices beyond the limit of device scaling. However, planarization is typically required for device fabrication because deviations from a flat surface can lead to device fault and/or different device characteristics within an IC or different device characteristics among concurrently manufactured devices. Chemical mechanical polishing (CMP) of the selected lattice-mismatched semiconductor materials is an option to smooth the surface of the material. However, the CMP surface must be smooth and surface impurities must be avoided. Additional cleaning of a polished surface during preparation should not substantially impair its smoothness. Thus, there exists a need to prepare a surface of lattice-mismatched materials in a confined or selectively grown area (e.g., an active region of crystalline materials), which may include planarized materials for subsequent processing.

Further, there is a need to reduce the surface roughness of semiconductor crystalline materials. For example, there is a need to reduce the surface roughness of semiconductor crystalline materials associated with various Aspect Ratio Trapping (ART) techniques in corresponding semiconductor devices.

SUMMARY OF THE INVENTION

Embodiments according to the present invention provide methods and apparatus to form semiconductor crystalline materials suitable for device fabrication and/or devices made thereby.

In one aspect, one embodiment of the invention can provide planarized heteroepitaxial regions (e.g., wafers) suitable for device fabrication and/or devices including the same.

In another aspect, one embodiment of the invention can provide clean planarized heteroepitaxial regions suitable for device fabrication and/or devices including the same.

In another aspect, one embodiment of the invention can provide reduced or low impurity planarized heteroepitaxial regions suitable for device fabrication and/or devices including the same.

In another aspect, one embodiment of the invention can provide planarized heteroepitaxial regions heated under selected conditions suitable for device fabrication and/or devices including the same.

In another aspect, one embodiment of the invention can provide planarized heteroepitaxial regions having selected characteristics suitable for device fabrication and/or devices including the same.

Therefore, it is an aspect of one embodiment of the invention to provide an epitaxially grown semiconductor crystalline material with a reduced surface roughness.

An alternative aspect of one embodiment of the invention is to provide a semiconductor crystalline material with a reduced surface roughness at a planarized (e.g., different) semiconductor crystalline material.

An alternative aspect of one embodiment of the invention is to provide an epitaxially grown crystalline material with a reduced surface roughness over an interface having reduced impurities to another grown crystalline material.

In yet another aspect, one embodiment of the invention provides a process for the epitaxial growth of a strained, low defect crystalline material at a planarized semiconductor crystalline material.

In yet another aspect, one embodiment of the invention provides a process for preparing a semiconductor crystalline material with reduced surface roughness for subsequent processing and/or semiconductor devices including the surface.

These aspects may be especially applicable to devices incorporating Aspect Ratio Trapping (ART) techniques, including but not limited to a mixed signal application device, a field effect transistor, a quantum tunneling device, a light emitting diode, a laser diode, a resonant tunneling diode and a photovoltaic device. The ART devices may have crystalline material epitaxially grown in openings or confined areas with an aspect ratio (depth/width)>1, or otherwise suitable for trapping most defects.

Additional aspects and utilities of the invention will be set forth in part in the description which follows and, in part, will be obvious from the description, or may be learned by practice of the invention.

BRIEF DESCRIPTION OF THE DRAWINGS

These and/or other aspects and utilities of the present general inventive concept will become apparent and more readily appreciated from the following description of the embodiments, taken in conjunction with the accompanying drawings, of which:

FIGS. 2(a)-(b) illustrate SEM images of (a) as-grown $Si_{0.2}Ge_{0.8}$ and in trenches and (b) after CMP.

FIG. 3 comprises FIGS. 3(a)-3(c).

FIG. 4 comprises FIGS. 4(a)-4(c).

FIG. 5, comprising FIGS. 5(a)-5(c).

FIG. 6, comprising FIGS. 6(a)-6(b).

FIG. 7, comprising FIGS. 7(a)-7(c).

FIG. 8, comprising FIGS. 8(a)-8(b).

FIG. 9 comprises FIGS. 9(a) and 9(b) where

DETAILED DESCRIPTION OF EMBODIMENTS

Figure 1A:
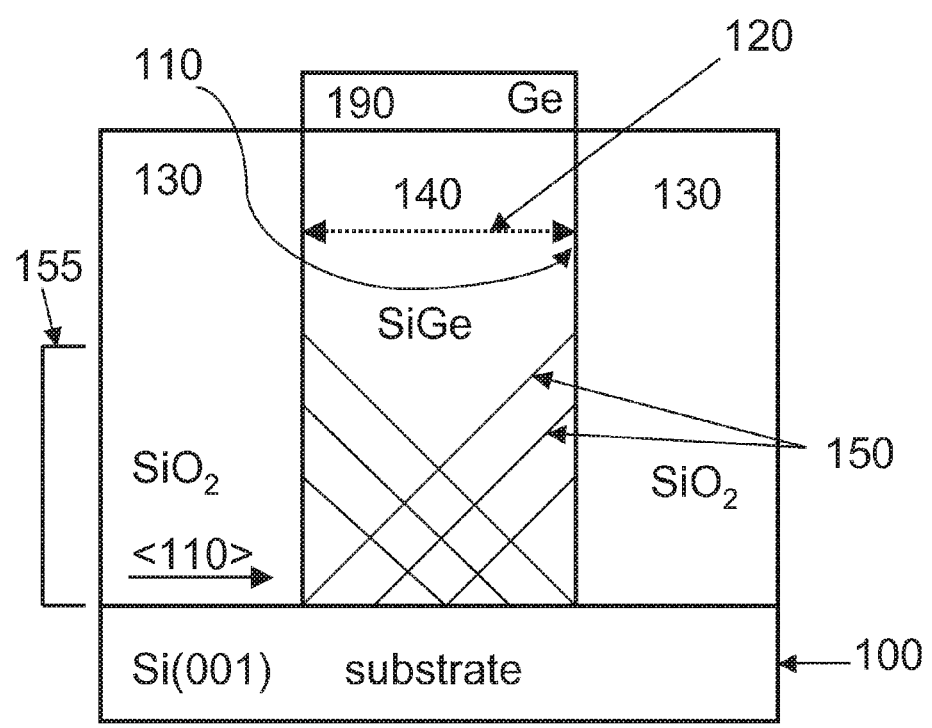
FIG. 1a is a diagram that illustrates a cross-sectional schematic of strained-Ge on SiGe in trenches using ART.

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

The formation of lattice-mismatched materials has many practical applications. For example, heteroepitaxial growth of group IV materials or compounds, and III-V, III-N and II-VI compounds on a crystalline substrate, such as silicon, has many applications such as photovoltaics, resonant tunneling diodes (RTD's), transistors (e.g., FET (which can be planar or 3D (e.g., finFET), HEMT, etc.), light-emitting diodes and laser diodes. As one example, heteroepitaxy of germanium on silicon is considered a promising path for high performance p-channel metal-oxide-semiconductor (MOS) field-effect transistors (FET) and for integrating optoelectronic devices with silicon complementary MOS (CMOS) technology. Heteroepitaxy growth of other materials (e.g., of group III-V, III-N and II-VI compounds and other group IV materials or compounds) also is beneficial for these and other applications.

Germanium (Ge), a group IV material, is one of the possible candidates for high-mobility channels for CMOS devices because of its higher carrier mobility compared with silicon (Si). In addition, compressive strain in Ge was reported to show further enhancement in carrier mobility likely caused by band splitting and reduction of hole effective mass. Significant improvements in device performance have been demonstrated using compressively-strained Ge channel. However, to date methods to form such structures and/or such structures remain difficult to achieve.

For example, the dislocation density of the epitaxially grown material can be unacceptably high for many applications. For example, the dislocation density of germanium directly grown on silicon can be as high as $10^8$-$10^9$ are due to the 4.2% lattice mismatch between the two materials—unacceptable for most device applications. Various approaches to reducing the defect density have been pursued, including compositional grading, and post-epi high-temperature annealing. However, these approaches may not be optimal for integration with silicon-based CMOS technology due to requirements for thick epi-layers and/or high thermal budgets, or due to incompatibility with selective growth at a density suitable for CMOS integration.

Aspect Ratio Trapping (ART) is a defect reduction technique that mitigates these problems. As used herein, "ART" or "aspect ratio trapping" refers generally to the technique(s) of causing defects to terminate at non-crystalline, e.g., dielectric, sidewalls, where the sidewalls are sufficiently high relative to the size of the growth area so as to trap most, if not all, of the defects. ART utilizes high aspect ratio openings, such as trenches or holes, to trap dislocations, preventing them from reaching the epitaxial film surface, and greatly reduces the surface dislocation density within the ART opening.

FIG. 1a is a diagram that shows a cross section of a lattice-mismatched material 140 of high quality above a defect trapping region 155 using ART. As illustrated here, a crystalline material 140 is epitaxially grown on substrate 100 (here, for example, on the (001) surface of a silicon substrate). By confining the crystalline growth within an opening 120 (e.g., trench, recess or the like) of insulator 130 with a sufficiently high aspect ratio (e.g., 1 or greater, 0.5 or greater), defects 150 (e.g., threading dislocations) formed while epitaxially growing the crystalline material 140 travel to and end at the sidewalls (e.g., insulator sidewalls) 110. Thus, the crystalline material 140 continues to grow without the continued growth of the defects 150, thereby producing crystal with reduced defects above the defect trapping region 155. Defects 150 in the crystalline material 140 can decrease in density with increasing distance from the bottom portion of the opening 120. Accordingly, the bottom portion of the second crystalline semiconductor material 140 comprises crystalline (e.g., lattice) defects, and the upper portion of the crystalline material is substantially exhausted of crystalline defects. Various crystalline defects 150 such as threading dislocations, stacking faults, twin boundaries, or anti-phase boundaries may thus be substantially eliminated from the upper portion of the crystalline material. This technique has been shown to be effective for growing low defectivity materials such as Ge, InP and GaAs selectively on Si in trenches e.g., 200-450 nm wide and of arbitrary length; an area large enough for devices such as a FET, for example. Such trenches can be wider or narrower.

In one example, the width of the opening 120 may be 400 nm or less, 350 nm or less, 200 nm or less, 100 nm or less or 50 nm or less; these sizes have been shown to be effective for ART (of course these sizes do not need to be used with ART). Alternatively, the width of the opening may be 5 μm or less. In another alternative, the width of the opening may be 1 μm or less. The opening may be formed as a trench (with the length of the trench running front to back as shown in FIG. 1a) in which case the width would be considered to be perpendicular to its length and height. The length of the trench may be arbitrary. Alternatively, the length of the trench may be substantially larger than the width of the trench, for example greater than 10 times larger, or greater than 100 times larger. In one example, the length of the trench can be 20 µm.

It is preferred, but not necessary, that the opening 120 is used to trap defects when epitaxially growing the crystalline material 140 using ART (aspect ratio trapping) techniques. (Aspect ratio "AR" is defined for trenches as the ratio of the trench height/trench width.) In such a case, the aspect ratio may be greater than 1, although it possible for the aspect ratio to be lower in ART devices, for example 0.5. In one embodiment, the crystalline material 140 can include two different semiconductor materials or more than one semiconductor material (e.g., GaAs/InP/InGaAs) such as first, second and third materials where the first material can be Ge or GaAs, can be less than 100 nm or can have bonding characteristics to a substrate and the third material is polished. Further details of example ART devices and ART techniques in which this invention may be incorporated may be found in U.S. patent application Ser. No. 11/436,198 filed May 17, 2006, Ser. No. 11/493,365 filed Jul. 26, 2006 and Ser. No. 11/852,078 filed Sep. 7, 2007, and U.S. patent application Ser. No. 12/476,460 filed Jun. 2, 2009 entitled "Improved Epitaxial Growth of Crystalline Material" and Ser. No. 12/503,597 filed Jul. 15, 2009 entitled "Polishing of Small Composite Semiconductor Materials", all of which are hereby incorporated by reference.

The substrate 100 in the above examples may include a group IV element or compound, such as germanium and/or silicon, e.g., (001) silicon. The crystalline material 140 may include at least one of a group IV element or compound, a III-V or III-N compound, or a II-VI compound. Examples of group IV elements include Ge, Si and examples of group IV compounds include SiGe. Examples of III-V compounds include aluminum phosphide (AlP), gallium phosphide (GaP), indium phosphide (InP), aluminum arsenide (AlAs), gallium arsenide (GaAs), indium arsenide (InAs), aluminum antimonide (AlSb), gallium antimonide (GaSb), indium antimonide (InSb), and their ternary and quaternary compounds. Examples of III-N compounds include aluminum nitride (AlN), gallium nitride (GaN), indium nitride (InN), and their ternary and quaternary compounds. Examples of II-VI compounds include zinc selenide (ZnSe), zinc telluride (ZnTe), cadmium selenide (CdSe), cadmium telluride (CdTe), zinc sulfide (ZnS), and their ternary and quaternary compounds.

Figure 1B:
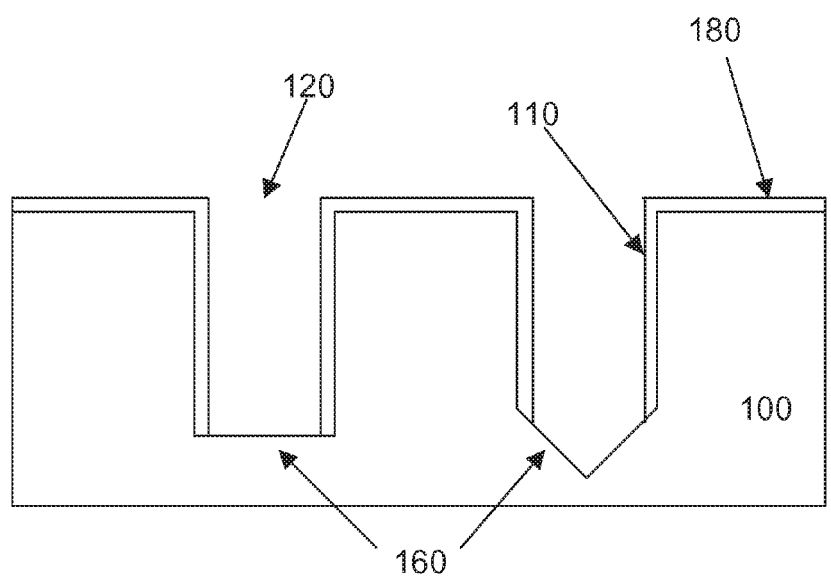
FIG. 1b is a diagram that illustrates a cross-sectional schematic of an alternate configuration (e.g., confined area for crystalline material) of an ART structure.
Figure 2:
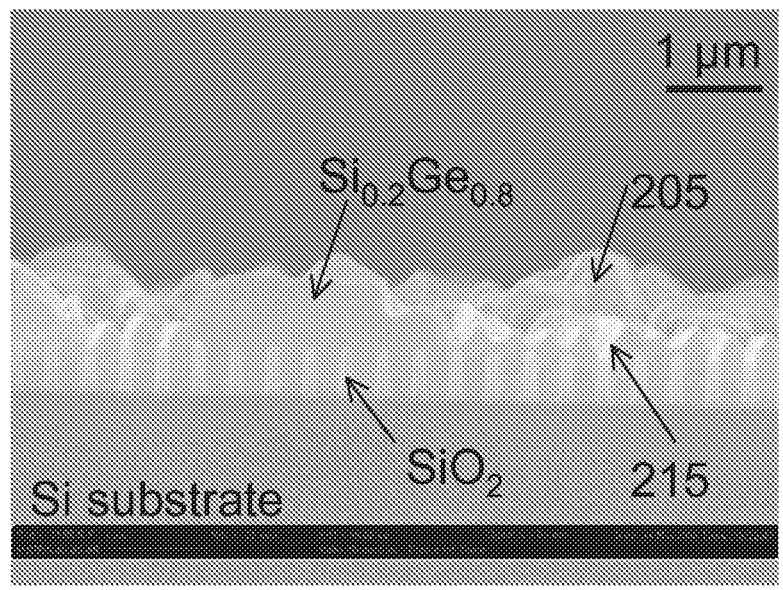
FIG. 2 comprises FIGS. 2(a)-2(b).
Figure 2:
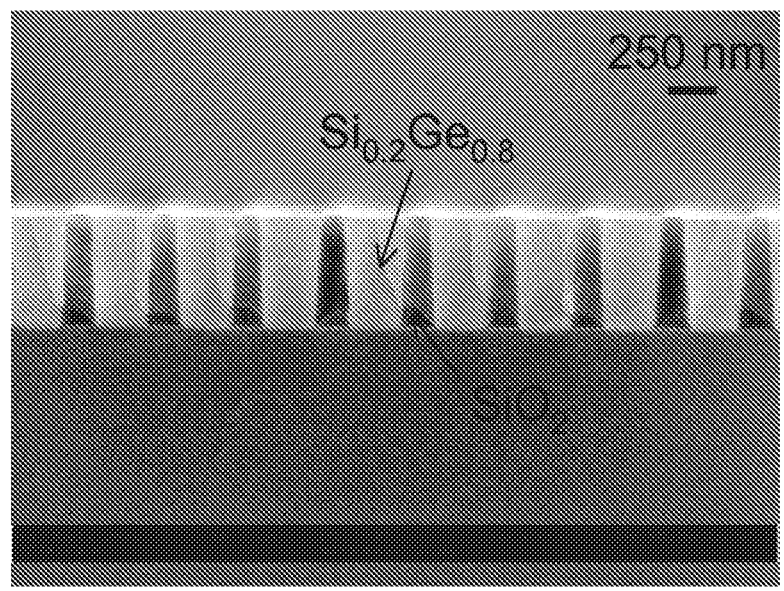

The layer of insulator need not be formed as a substantially planar layer. For example, the insulator may be formed of a thin layer that conforms to an undulating surface of the substrate on which it is created. FIG. 1b illustrates an example including a substrate that has openings/recesses/trenches 120 etched into the substrate 100. An insulating layer 180 has been formed across the substrate 100 conforming to the surface topography of the etched substrate 100. The insulating layer 180 is configured at the bottom of the openings/trenches to expose portions 160 of the substrate 100 for subsequent lattice-mismatched crystalline material. In this case, sidewalls 110 of the insulating layer 180 can be formed by deposition on or oxidation of the substrate 100 and are not formed by a separate photolithography process. Exemplary configurations of the openings 120 and portions 160 are illustrated however, embodiments of the invention are not intended to be so limited, for example, as other linear, tiered or nonlinear cross-sections may be used for the openings 120 and the portions 160.

An embodiment of the invention is directed to a device including an epitaxially grown first crystalline semiconductor material over a planarized second crystalline semiconductor surface. Preferably the grown first crystalline semiconductor material has a top surface with reduced roughness. Preferably the grown first crystalline semiconductor material is compressively or elastically strained. Preferably the grown first crystalline semiconductor material has low-defectivity that may be similar to the underlying second crystalline semiconductor material. Preferably, the second crystalline semiconductor material is different from the first crystalline material. Preferably, the planarized second crystalline semiconductor surface can be cleaned without impairing a reduced roughness of its surface. Preferably, impurities at an interface between the second crystalline semiconductor material and the first crystalline semiconductor material can be reduced.

An embodiment of the invention is directed to a device including a semiconductor crystalline material over a planarized lattice-mismatched material in an opening in an insulator. FIG. 1a shows one example, illustrating a cross-sectional view of a portion of an exemplary device. As shown in FIG. 1a, one example includes the crystalline material 140 (e.g., SiGe alloy; $Si_xGe_{1-x}$; $Si_{0.2}Ge_{0.8}$) grown on a substrate 100 in the opening 120 defined in the insulator 130 for a non-Si channel device (e.g., MOSFET). The substrate 100 may be a crystalline material such as silicon, Ge or sapphire. Insulator 130 is preferably a non-crystalline material such as a dielectric material including silicon nitride, $SiO_2$ or the like. The crystalline material 140 at least at some stage has a surface above the top surface of insulator 130. A planarized surface preferably includes at least a surface of portions of the crystalline material 140 and the insulator 130. An additional semiconductor crystalline material 190 is preferably provided over/at the crystalline material 140.

The following description in connection with FIGS. 1a-9 explains examples of how surfaces of a low-defect strained crystalline material at or grown over a polished structure (e.g., an ART structure) may be obtained with reduced surface roughness. The following description further describes examples of how surfaces of the lattice-mismatched or crystalline semiconductor material within a confined space (e.g., crystalline material 140 within insulator 130) may be prepared or provided with prescribed surface characteristics. Although this description is in connection with specific materials and process parameters, it will be apparent that the description is exemplary only, and should not be considered to limit the invention to such materials and process parameters.

The following materials and process parameters were used for the Ge grown as discussed in connection with FIGS. 1a-9. The starting substrates used in this work were crystalline silicon, 200 mm diameter and (001) oriented. A 500-nm-thick thermal oxide was grown on the substrate. The oxide layer was patterned into trenches along [110] direction of the silicon substrate having 200 nm widths. The trenches were formed using conventional photolithography techniques and a reactive ion etching (RIE) step. The patterned substrates were then cleaned in Pirana, SC2, and dilute HF solutions sequentially. Removal of fluorocarbon residues caused by RIE was accomplished using a 25-nm-thick sacrificial oxidation and subsequent dilute HF cleaning (e.g., HF oxide etch). The final trench height was 490 nm after this cleaning procedure. SiGe layers over 500 nm were grown by chemical vapor deposition (CVD) on the exposed Si substrate (e.g., in the trenches) in an industrial ASM Epsilon E2000 system. This CVD system is a horizontal, cold-wall, single wafer, load-locked reactor with a lamp-heated graphite susceptor in a quartz tube.

$Si_{0.2}Ge_{0.8}$ layers were grown in the trenches at 600° C. and 80 Torr for 1200 sec using ASM Epsilon E2000 commercial grade epitaxy reactor. 25% germane ($GeH_4$) diluted in $H_2$ and 100% dichlorosilane ($SiH_2Cl_2$) was used as a precursor of germanium and silicon, respectively and hydrogen as a diluent gas. Chemical-mechanical-polishing (CMP) of $Si_{0.2}Ge_{0.8}$ was performed to make the SiGe layers coplanar with oxide sidewall using a Strasbaugh 6EC. A Nalco 2360 slurry (70 nm colloidal silica) was used. Nalco 2360 slurry is a commercially available colloidal silica polishing slurry having submicron silica particles in an aqueous solution. Either NaOCl, NH4OH, or H2O2 solution was added to the diluted slurry to enhance the SiGe removal rate relative to the oxide sidewall. Thus, each slurry mix consisted of part Nalco 2360, part chemical additive, and the remainder was deionized water (DI) water, adding up to 100% of the slurry mix. An exemplary CMP process of the Strasbaugh 6EC included ramp-up, a polish, ramp-down and rinse.

An exemplary post-CMP clean, using the Verteq Goldfinger single-wafer megasonic post-CMP tool, included a contamination spin-off, process time, rinse time, and spin dry time. In one example, megasonic power of 125 W and DI water at a rate of 1.7-3 L/min may be used. After the megasonic post-CMP clean process, the substrates were cleaned in a diluted HF solution. Then, a Ge layer (e.g., 42-nm-thick) was grown on coplanar $Si_{0.2}Ge_{0.8}$ at 350° C. and at the same pressure using the same reactor as the $Si_{0.2}Ge_{0.8}$ growth. Just prior to the Ge growth step in the growth chamber, the wafers were baked at 750, 810, or 870° C. for 1 min in $H_2$ at the same growth pressure. For comparison, Ge was grown on some wafers without the pre-bake step. Strain of Ge (190) on $Si_{0.2}Ge_{0.8}$ (140) was determined from high-resolution reciprocal space map (RSM) of asymmetric {224} peaks using a Panalytical X'Pert diffractometer. Scanning electron microscopy (SEM) and transmission electron microscopy (TEM) were used for the characterization. Cross-sectional scanning electron microscope (SEM) analysis samples were observed using a Zeiss Supra 40 field-emission SEM. Cross-sectional TEM samples were prepared by mechanical polishing and Ar ion milling and the TEM images were taken on a JEOL JEM 2100 microscope operating at 200 kV.

FIGS. 2(a) and 2(b) show $Si_{0.2}Ge_{0.8}$ in oxide trenches before and after the $Si_{0.2}Ge_{0.8}$ CMP, respectively. The surface of the grown $Si_{0.2}Ge_{0.8}$ is above a top surface of the oxide trenches. The surface of the $Si_{0.2}Ge_{0.8}$ grown over the oxide trenches was very rough because the coalescence of $Si_{0.2}Ge_{0.8}$ was not completely uniform as shown in FIG. 2(a). For example, coalescence of the $Si_{0.2}Ge_{0.8}$ is indicated by arrow 205, however an un-coalesced portion of the $Si_{0.2}Ge_{0.8}$ is indicated by arrow 215. A smooth $Si_{0.2}Ge_{0.8}$ coplanar with the oxide trenches was obtained after CMP as shown in FIG. 2(b), which is suitable for strained-Ge growth and device applications.

Figure 3A:
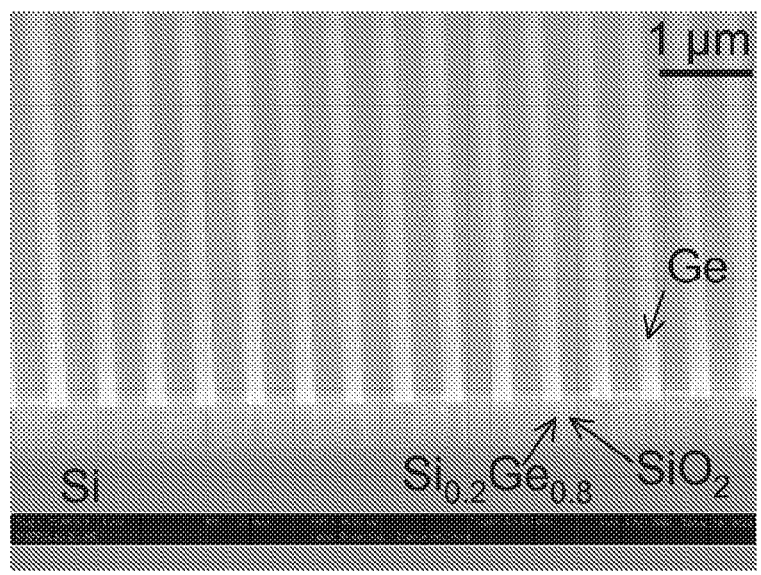
FIGS. 3(a)-3(c) illustrate (a) SEM and (b) cross-sectional TEM image of Ge on $Si_{0.2}Ge_{0.8}$ in trenches without pre-bake step prior to Ge growth and (c) the magnified TEM image at $Ge/Si_{0.2}Ge_{0.8}$ interface.
Figure 3B:
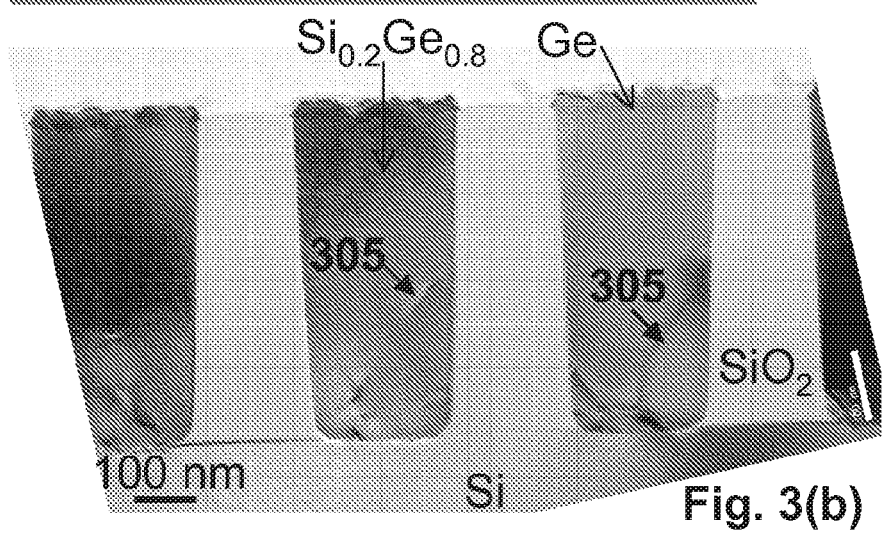
Figure 3C:
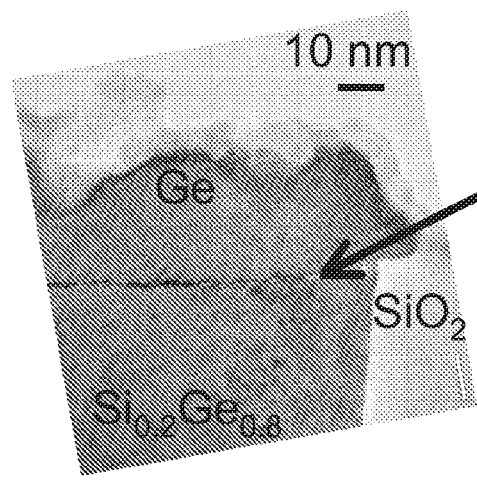

FIG. 3(a) is a diagram that illustrates an SEM image of thin Ge on coplanar $Si_{0.2}Ge_{0.8}$ in oxide trenches without the pre-bake step prior to the Ge growth. As shown in FIG. 3(a), the Ge growth was selective without the formation of Ge islands on the oxide. To evaluate the Ge crystalline quality and the interface of Ge/$Si_{0.2}Ge_{0.8}$, TEM experiments were performed. FIG. 3(b) is a diagram that illustrates cross-sectional TEM image of the Ge on $Si_{0.2}Ge_{0.8}$ in trenches from FIG. 3(a). As shown in FIG. 3(b), threading dislocations (TDs) from the $Si_{0.2}Ge_{0.8}$/Si interface were trapped by ART techniques as indicated by arrows 305 and the top part of the $Si_{0.2}Ge_{0.8}$ in the trenches has substantially reduced defects or is free of TDs. The interesting thing is that the thin Ge on top of the $Si_{0.2}Ge_{0.8}$ is not smooth. FIG. 3(c) is a diagram that illustrates a magnified portion of the cross-sectional TEM image of FIG. 3(b). The magnified image shown in FIG. 3(c) exhibits a clear interface between Ge and $Si_{0.2}Ge_{0.8}$ as indicated by an arrow 315. Even after the polishing and cleaning procedures, poor Ge crystalline quality resulted including a rough surface as exemplarily illustrated in FIGS. 3(a)-3(c) grew on the $Si_{0.2}Ge_{0.8}$.

Figure 4A:
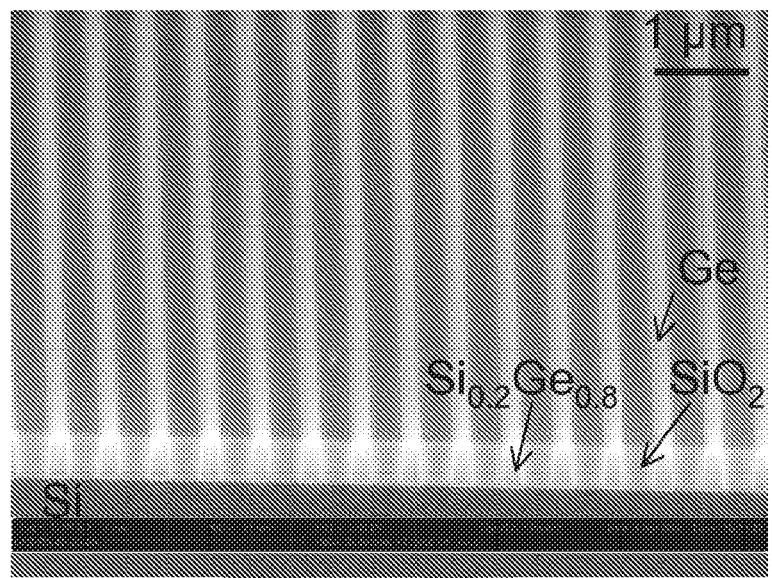
FIGS. 4(a)-4(c) illustrate (a) SEM and (b) cross-sectional TEM image of Ge on $Si_{0.2}Ge_{0.8}$ in trenches with the 750° C. pre-bake step prior to Ge growth and (c) the magnified TEM image at $Ge/Si_{0.2}Ge_{0.8}$ interface.
Figure 4B:
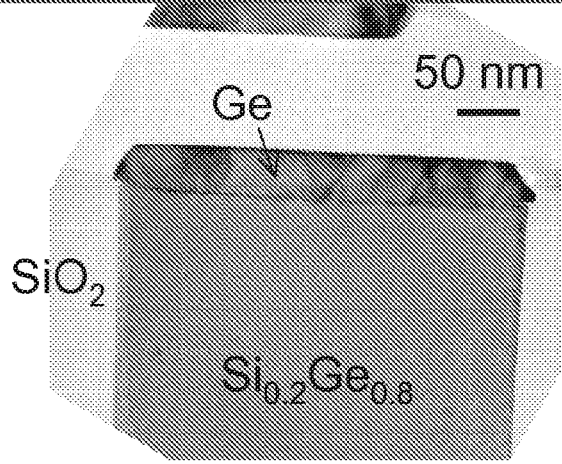
Figure 4C:
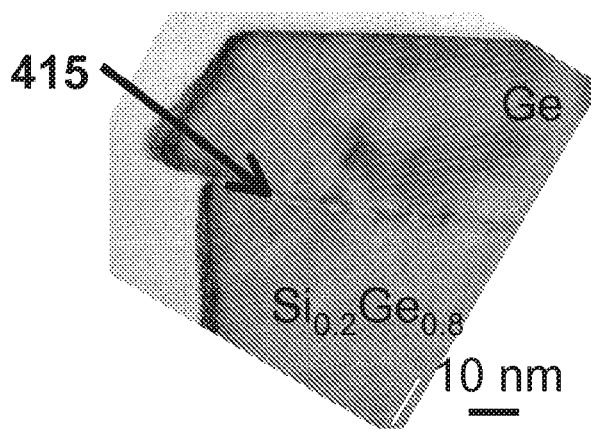

To determine a pre-bake temperature and a corresponding effect on the quality of thin Ge on $Si_{0.2}Ge_{0.8}$, a pre-bake was performed at 750° C. for one minute before the Ge growth and the results are shown in FIGS. 4(a)-4(c). FIG. 4(a) is a diagram that illustrates an SEM image of Ge on coplanar $Si_{0.2}Ge_{0.8}$ in oxide trenches with the 750° C. pre-bake, FIG. 4(b) is a cross-sectional TEM image of the Ge on $Si_{0.2}Ge_{0.8}$ of FIG. 4(a) and FIG. 4(c) illustrates a magnified portion of FIG. 4(b). In FIG. 4(a), the SEM image shows that the sample surface is clean with a good growth selectivity of Ge. In FIG. 4(b), the cross-sectional TEM image shows the Ge layer is much smoother than the Ge layer without the pre-bake step shown in FIG. 3(c). However, compared to the defect-free underlying $Si_{0.2}Ge_{0.8}$, the Ge layer shown in FIG. 4(c) is more defective and the defects are mainly originated from Ge/$Si_{0.2}Ge_{0.8}$ interface. The magnified image of FIG. 4(c) shows a clear interface and impurities between Ge and $Si_{0.2}Ge_{0.8}$ as indicated by arrow 405. Thus, the 750° C. pre-bake shows some improvement in the quality of thin Ge on $Si_{0.2}Ge_{0.8}$ compared to the Ge on $Si_{0.2}Ge_{0.8}$ shown in FIG. 3(a)-3(c). However, removal of impurities such as the moisture and oxygen at the interface as shown in FIG. 4(c) may be insufficient so that defects were generated from the interfacial impurities.

Figure 5A:
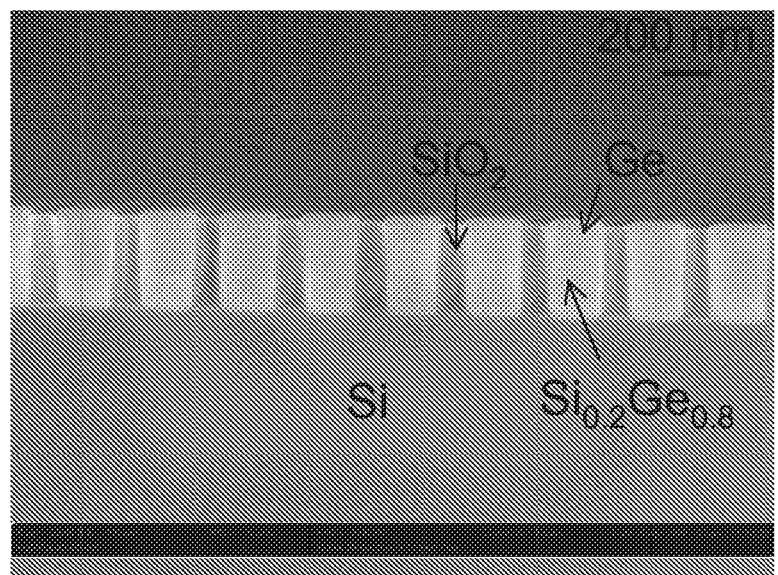
FIGS. 5(a)-5(c) illustrate (a) SEM and (b) cross-sectional TEM image of Ge on $Si_{0.2}Ge_{0.8}$ in trenches with the 810° C. pre-bake step prior to Ge growth and (c) the magnified TEM image at $Ge/Si_{0.2}Ge_{0.8}$.
Figure 5B:
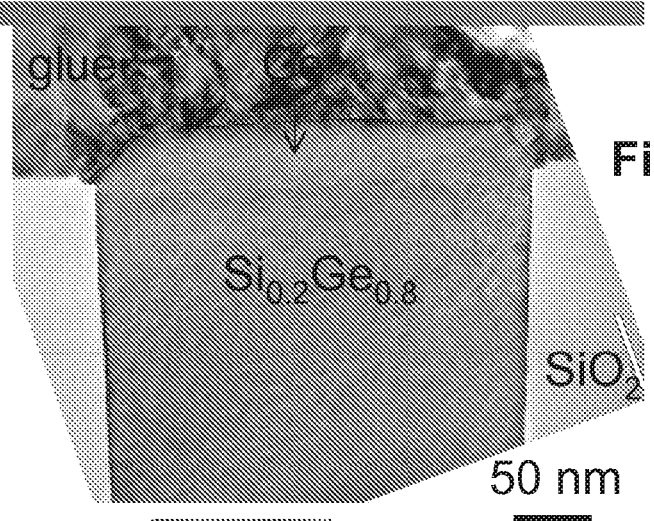
Figure 5C:
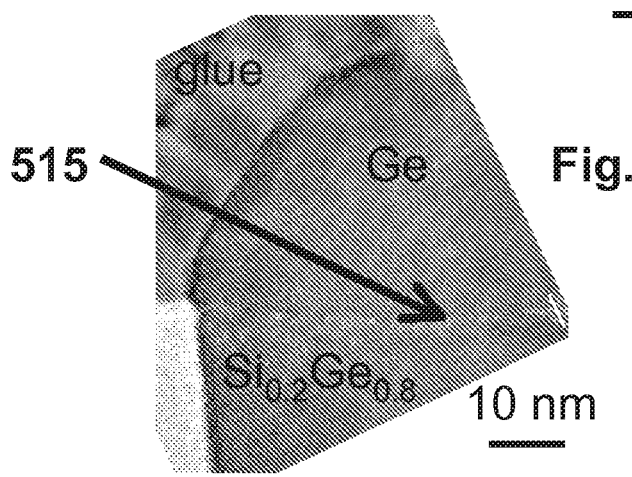

To determine removal of interfacial impurities and crystalline quality of Ge, pre-bake was performed at 810° C. prior to Ge growth and the results are shown in FIGS. 5(a)-5(c). FIG. 5(a) is a diagram that illustrates an SEM image of Ge on coplanar $Si_{0.2}Ge_{0.8}$ in oxide trenches with the 810° C. pre-bake, FIG. 5(b) is a cross-sectional TEM image of the Ge on $Si_{0.2}Ge_{0.8}$ of FIG. 5(a) and FIG. 5(c) illustrates a magnified portion of FIG. 5(b). As shown in FIG. 5(a), the Ge sample surface shows good growth selectivity from the SEM image. As shown in FIG. 5(b), the Ge layer does not show noticeable defects and is similar to the underlying defect-free $Si_{0.2}Ge_{0.8}$ in terms of defectivity. The interfacial impurities are slightly shown in FIG. 5(c) as indicated by an arrow 515. However, the interfacial impurities of FIG. 5(c) are much less than ones without pre-bake or the pre-bake at 750° C. and did not cause the generation of defects compared to the ones without pre-bake or the pre-bake at 750° C. Thus, a pre-bake at higher temperature (e.g., 810° C.) can lead to better removal of interfacial impurities at Ge/$Si_{0.2}Ge_{0.8}$ interface, which should make the crystalline quality of Ge even better.

Figure 6A:
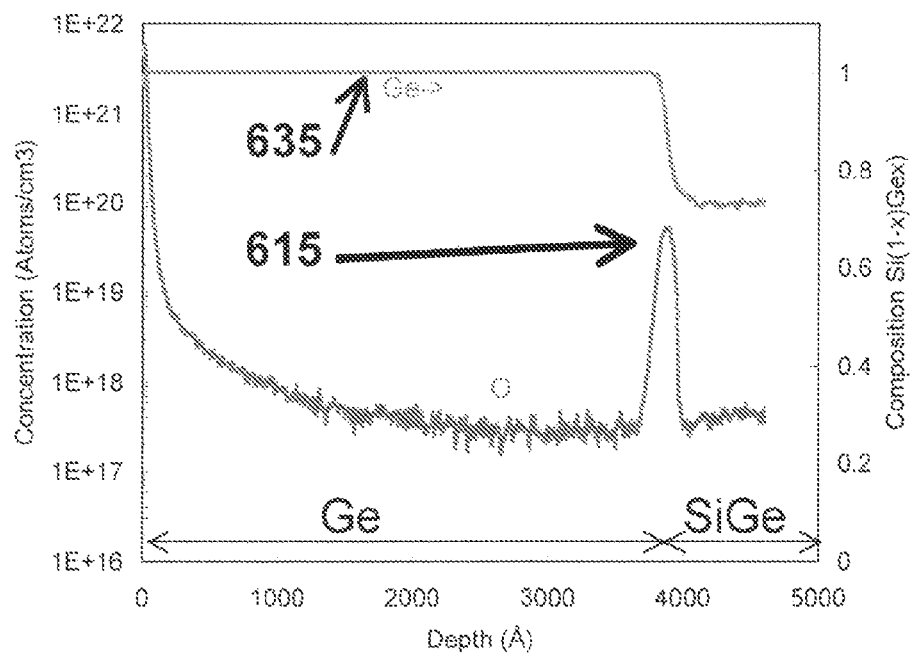
FIGS. 6(a)-6(b) illustrate SIMS depth profiles of oxygen of blanket $Ge/Si_{0.2}Ge_{0.8}$ (a) without pre-bake and (b) with 810° C. pre-bake step prior to Ge growth.
Figure 6B:
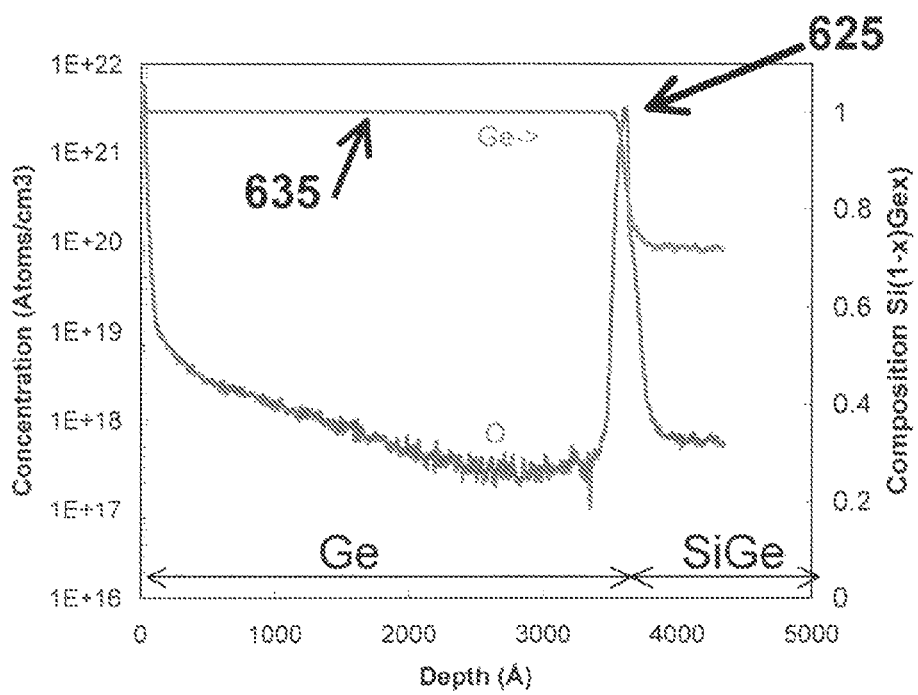

To evaluate the removal (e.g., decrease) of interfacial impurities by the pre-bake, the concentration of oxygen 605 at the Ge/$Si_{0.2}Ge_{0.8}$ was measured using secondary ion mass spectroscopy (SIMS). FIGS. 6(a) and 6(b) are diagrams that illustrate SIMS depth profiles of 380-nm-thick Ge layer grown on blanket $Si_{0.2}Ge_{0.8}$ after 810° C. pre-bake and without the pre-bake, respectively. As shown in FIGS. 6(a)-6(b), peak oxygen concentration 615 at the Ge/$Si_{0.2}Ge_{0.8}$ interface is about $4\times10^{19}$ atoms/cm$^3$ for the 810° C. pre-baked sample prior to Ge growth, but peak oxygen concentration 625 at the Ge/Si$_{0.2}$Ge$_{0.8}$ interface is 2×10$^{21}$ atoms/cm$^3$ without the pre-bake. This result indicates the oxygen concentration at the interface was reduced by almost two orders of magnitude after the 810° C. pre-bake. Also, illustrated in FIGS. 6(a) and 6(b) is the composition amount of Ge 635 plotted by depth through the 380 nm Ge layer on the blanket Si$_{0.2}$Ge$_{0.8}$ layer.

Figure 7A:
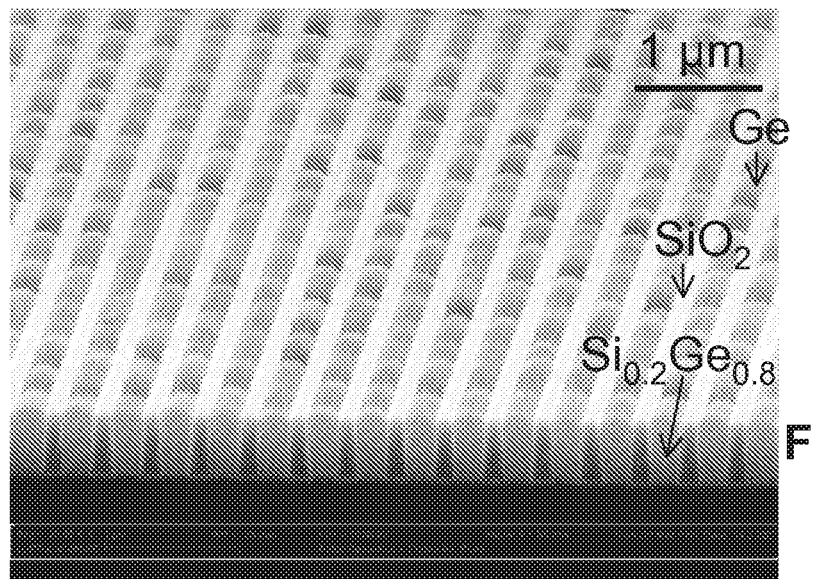
FIGS. 7(a)-7(c) illustrate (a) SEM and (b) cross-sectional TEM image of thin Ge on $Si_{0.2}Ge_{0.8}$ in trenches with the 870° C. pre-bake step prior to Ge growth and (c) the magnified TEM image at $Ge/Si_{0.2}Ge_{0.8}$ interface.
Figure 7B:
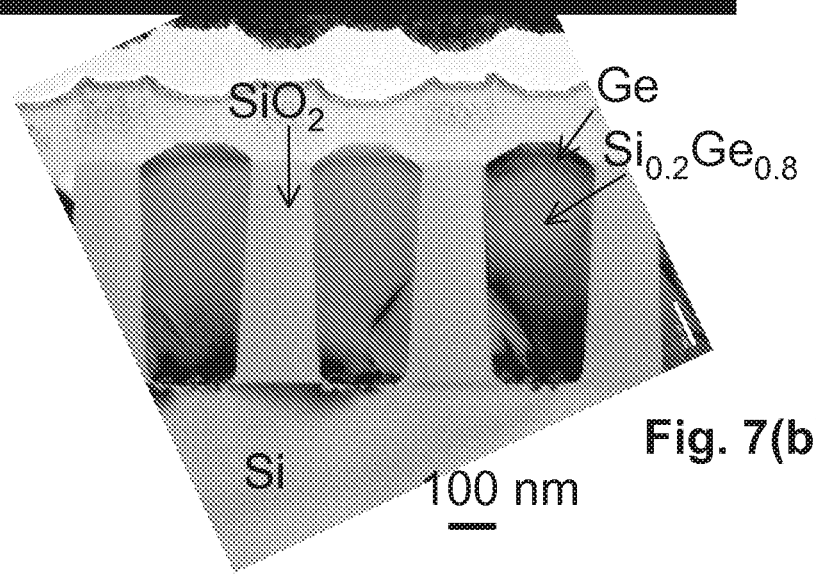
Figure 7C:
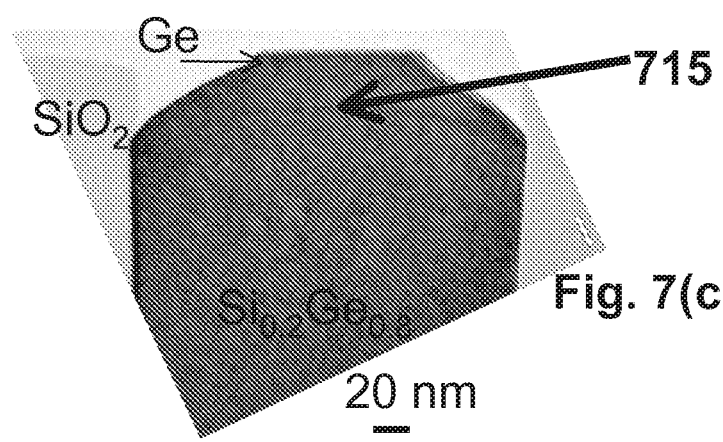

To determine removal of interfacial impurities and crystalline quality of Ge, pre-bake was performed at 870° C. prior to Ge growth and the results are shown in FIGS. 7(a)-7(c). Pre-bake at 870° C. may determine an upper limit of the pre-bake temperature. FIG. 7(a) is a diagram that illustrates an SEM image of Ge on coplanar Si$_{0.2}$Ge$_{0.8}$ in oxide trenches with the 870° C. pre-bake. FIG. 7(b) is a cross-sectional TEM image of the Ge on Si$_{0.2}$Ge$_{0.8}$ of FIG. 7(a) and FIG. 7(c) illustrates a magnified portion of FIG. 7(b). FIG. 7(a) illustrates that Ge/Si$_{0.2}$Ge$_{0.8}$ structure in trenches shows an undulation along the trench after the 870° C. pre-bake and the Ge growth. FIGS. 7(b) and 7(c) show that Ge/Si$_{0.2}$Ge$_{0.8}$ interface 715 is curved or round and substantially no interfacial impurities were found at the Ge/Si$_{0.2}$Ge$_{0.8}$ interface. The results shown in FIGS. 7(a)-7(c) indicate that the 870° pre-bake removes interfacial impurities very well compared to the pre-bake at lower temperature. As shown in FIG. 7(a) however, the undulated surface of Ge/Si$_{0.2}$Ge$_{0.8}$ is not suitable for device application. Thus, a surface of the Ge/Si$_{0.2}$Ge$_{0.8}$ may not suitable for device application if the bake temperature is too high.

Figure 8A:
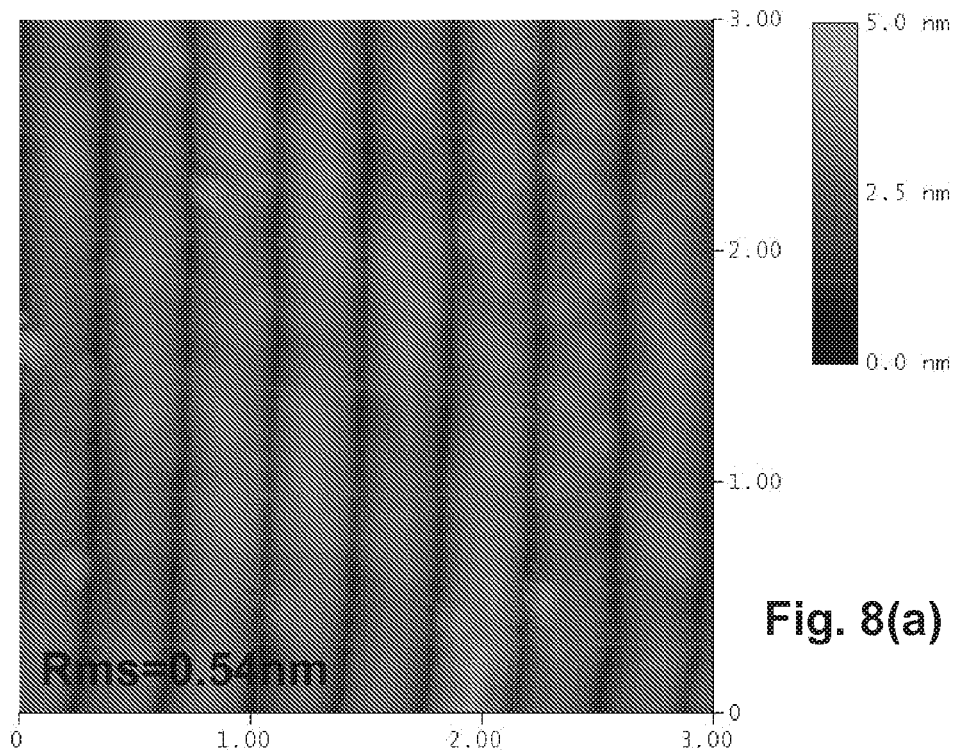
FIGS. 8(a)-8(b) illustrate AFM images of thin Ge on $Si_{0.2}Ge_{0.8}$ in trenches with (a) 810° C. and (b) 870° C. pre-bake step prior to Ge growth.
Figure 8B:
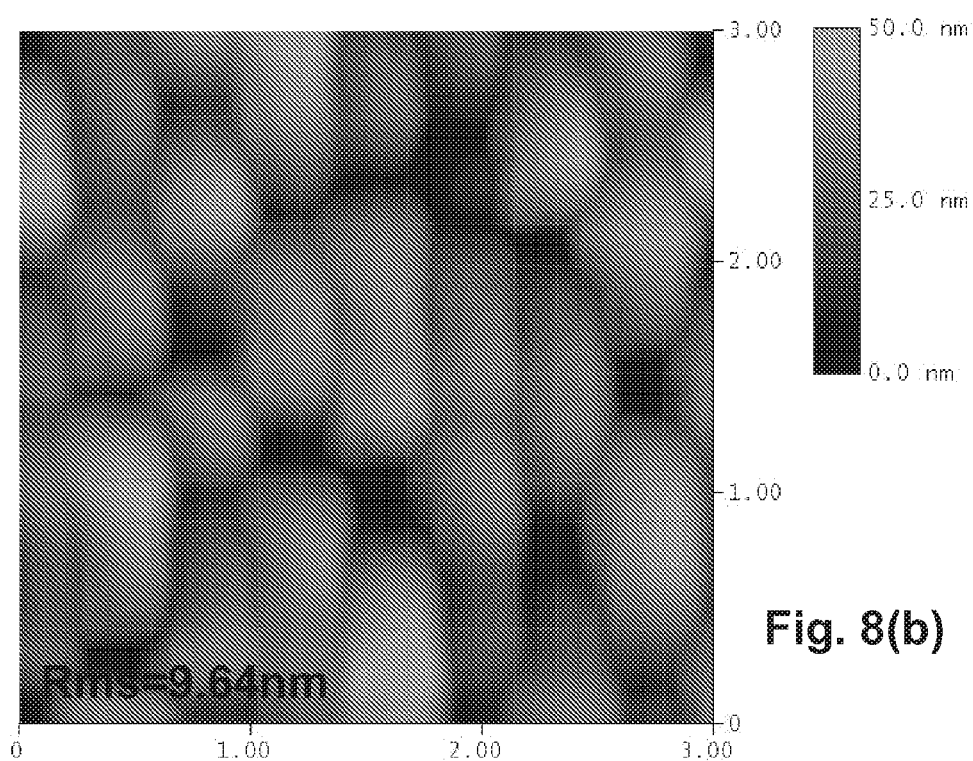

The sample roughness was characterized by tapping-mode atomic force microscopy (AFM) with a Veeco Dimension 3100. FIGS. 8(a) and 8(b) are diagrams that illustrate atomic force microscope (AFM) images of Ge/Si$_{0.2}$Ge$_{0.8}$ in trenches with 810° C. and 870° C. pre-bake, respectively. The 810° C. pre-baked sample resulted in a 0.54 nm root-mean-square (RMS) roughness, which can be calculated from the AFM image, but RMS roughness of the 870° C. pre-baked sample is 9.64 nm, which is almost 20 times higher due to the undulation along the trenches.

As described above, the Ge layer of crystalline material at least at some stage in during its growth has a surface. In one embodiment, the surface the Ge layer (190) preferably has a surface roughness Rms of less than 7 nm, less than 5 nm, less than 3 nm, or less than 1 nm or less than 0.3 nm.

Figure 9A:
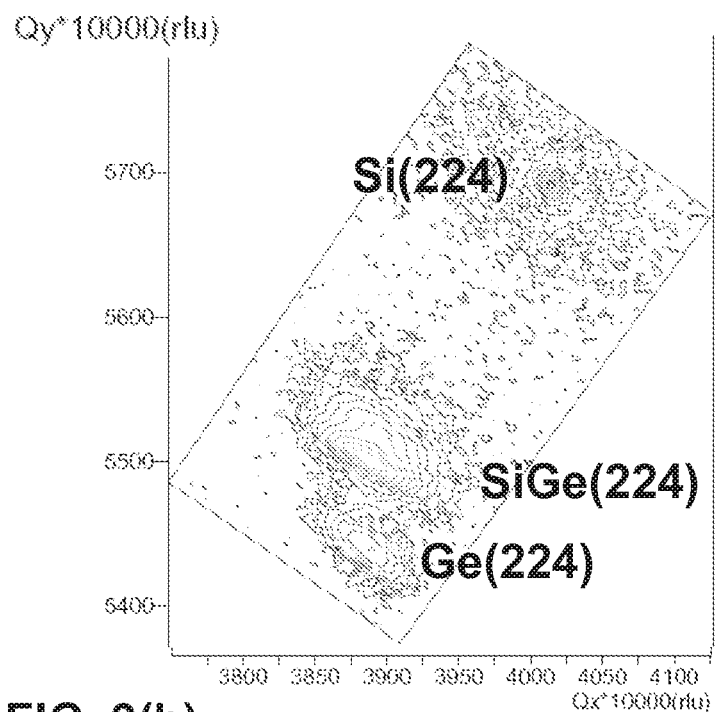
FIG. 9(a) illustrates RSM of {224} peaks of thin Ge on $Si_{0.2}Ge_{0.8}$ in trenches with the 810° pre-bake
Figure 9B:
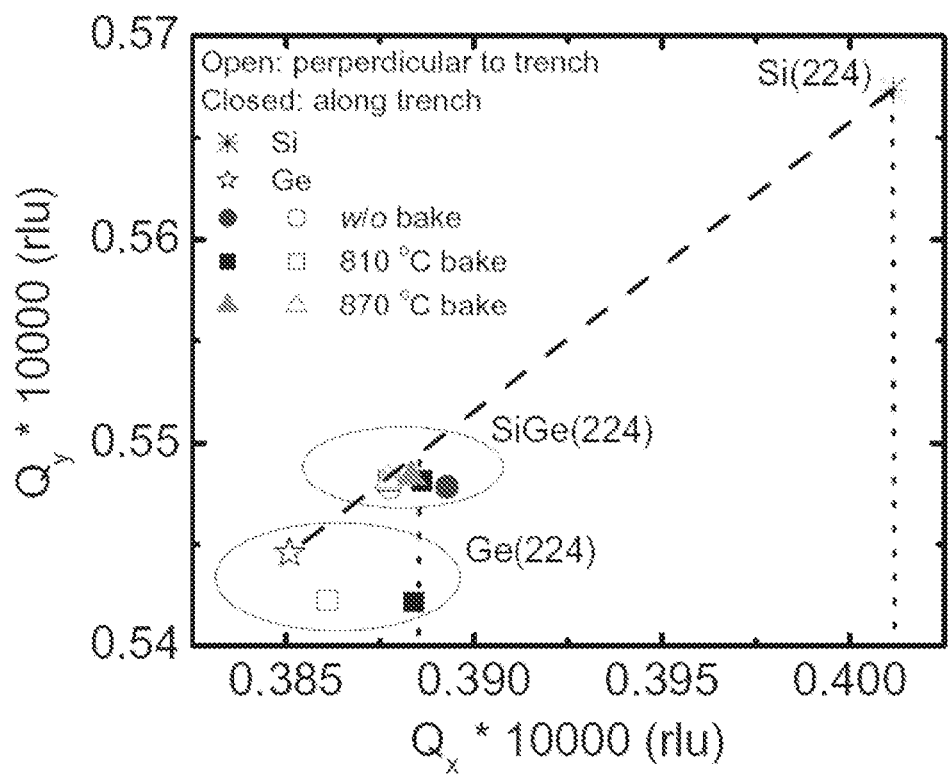
FIG. 9(b) illustrates the plot showing peak positions of Si, $Si_{0.2}Ge_{0.8}$, and Ge of the Ge on $Si_{0.2}Ge_{0.8}$ in trenches with different pre-bake conditions.

From such exemplary process conditions, strained-Ge/Si$_{0.2}$Ge$_{0.8}$ structure in trenches was successfully fabricated. Strains in exemplary embodiments of Ge and SiGe can be evaluated using high-resolution RSM of {224} peaks. FIG. 9(a) shows {224} RSM of 42-nm-thick Ge on Si$_{0.2}$Ge$_{0.8}$ in trenches baked at 810° C. prior to Ge growth. {224} peaks of thin Ge and Si$_{0.2}$Ge$_{0.8}$ in trenches and Si substrate are shown in FIG. 9(a). X-ray diffraction measurement was performed along and perpendicular to the trenches to evaluate strain of Ge and Si$_{0.2}$Ge$_{0.8}$ in both directions. The {224} peak positions of the samples baked at different conditions were plotted in RSM for comparison as shown in FIG. 9(b). As shown in FIG. 9(b), theoretical {224} peak positions of Si and Ge were marked. If SiGe is completely relaxed, its peak will be located on the dashed line between Si and Ge peaks in FIG. 9(b), but it will be on the dot line along surface normal of the layer if they are fully strained. Thus, the peaks of partially relaxed epi-layers will locate between the two lines. From FIG. 8(b), it was found that both Si$_{0.2}$Ge$_{0.8}$ and Ge are more strained along the trench direction, but more relaxed perpendicular to the trench direction. In addition, Si$_{0.2}$Ge$_{0.8}$ is almost fully relaxed perpendicular to the trenches even without the bake but the peak position of Si$_{0.2}$Ge$_{0.8}$ along the trench direction gets closer to the dash line at higher bake temperature indicating it is more relaxed by higher temperature bake. From the lattice constant calculated from the position of Ge (224) peaks, in one embodiment, the 42-nm-thick Ge has 1% and 0.45% elastic strain along and perpendicular to the trench direction, respectively.

As described above, the Ge layer of crystalline material is formed over or at the underlying lattice-mismatched semiconductor crystalline SiGe alloy. Si has smaller lattice constant about 4% smaller than Ge. The lattice-mismatch in this example will vary approximately linearly based the percentages of Si and Ge in the SiGe. A thickness of the Ge layer can vary, but preferably remains sufficiently thin such that the strain is maintained. In one embodiment, the Ge layer (190) is preferably at least 20 nm thick, at least 40 nm thick, at least 100 nm thick or at least 200 nm thick.

In one embodiment, the crystalline material 190 has elastic strain at least along a first direction, along a second direction perpendicular to the first direction or along both the first and second directions. Preferably the strain is at least 0.5%, at least 1%, at least 2% or at least 4% compressive strain along the first direction or at least 0.5%, at least 1%, at least 2%, at least 4% compressive strain along the second direction.

While these examples are directed to the CVD growth of germanium on SiGe, other materials may be used. For example, when epitaxially growing by CVD compounds of Group III (Al, Ga, In) and Group V (P, As) such as GaAs, AlGaAs, InGaAs, InAlAs, InGaAlAs, InP, GaP, InGaP, InAlGaP etc., a growth temperature of 500-800° C. is normally used to obtain sufficient growth rates on a blanket substrate. According to a further example, these materials may be grown by CVD at a temperature less than 500° C. or 400-500° C. when grown over a planarized first crystalline material. However, the temperature for the pre-bake or preparation process (e.g., cleaning at higher temperature in H$_2$ gas) before the growth step is preferably independent of the growth temperature for semiconductor crystalline material to be used.

As another example, compounds of Group III (Al, Ga, In) and Group V (Sb) such as GaSb, AlSb and InSb can be epitaxially grown by CVD on a blanket substrate with a growth temperature in the range of 400-700° C. According to a further example, these materials may be grown by CVD at a temperature less than 400° C. or 300-400° C. when grown over a planarized first crystalline material. However, the temperature for the pre-bake or preparation process (e.g., cleaning at higher temperature in H$_2$ gas) before the growth step is preferably independent of the growth temperature for semiconductor crystalline material to be used.

As another example, Group III-N compounds can be epitaxially grown by CVD on a blanket substrate with a growth temperature in the range of 500-1100° C. According to a further example, these materials may be grown by CVD at a temperature less than 500° C. or 400-500° C. when grown over a planarized first crystalline material. However, the temperature for the pre-bake or preparation process (e.g., cleaning at higher temperature in H$_2$ gas) before the growth step is preferably independent of the growth temperature for semiconductor crystalline material to be used.

As another example, Group II-VI compounds can be epitaxially grown by CVD on a blanket substrate with a growth temperature in the range of 250-600° C. According to a further example, these materials may be grown by CVD at a temperature less than 250° C. or 200-250° C. when grown over a planarized first crystalline material. However, the temperature for the pre-bake or preparation process (e.g., cleaning at higher temperature in H$_2$ gas) before the growth step is preferably independent of the growth temperature for semiconductor crystalline material to be used.

As another example, Group IV elements and compounds can be epitaxially grown by CVD on a blanket substrate with a growth temperature in the range of 400-1000° C. According to a further example, these materials may be grown by CVD at a temperature less than 400° C. or 300-400° C. when grown over a planarized ART crystalline material. However, the temperature for the pre-bake or preparation process (e.g., cleaning at higher temperature in $H_2$ gas) before the growth step is preferably independent of the growth temperature for semiconductor crystalline material to be used.

Thus, for the Group IV, III-N and II-VI materials in accordance with the above, it is preferred, but not necessary that an elastically strained, low defect layer having reduced surface roughness be provided according to embodiments as variously described above.

According to embodiments of the application, low-defectivity, compressively-strained Ge on polished $Si_{0.2}Ge_{0.8}$ fabricated in oxide-trenches using ART techniques was achieved. In one exemplary embodiment however, an increasingly higher pre-bake temperature may benefit interface characteristics but exceed a thermal tolerance of a device or of the confined crystalline material resulting in unacceptably high surface roughness (rms). One potential cause of the high surface roughness may be lattice-mismatch strain in the confined crystalline material that cannot be released through other mechanisms, which can result in a limited thermal budget for a cleaning or pre-bake process.

As described above, some embodiments according to the application used CMP and a preparation or pre-bake process prior to crystalline growth to improve a surface characteristic or to obtain high quality substantially defect-free and smooth semiconductor crystalline material, however embodiments are not intended to be so limited as various gases and/or intervals may be used. In one embodiment, a pre-bake or cleaning process prior to the growth of the crystalline material 190 lasted for 1 minute. In a further example, the pre-bake process can be at least 10 seconds long, at least 30 seconds long, at least 2 minutes long, at least 5 minutes long or at least 10 minutes long. In a further example, a pre-bake temperature range can be a smaller range within or slightly above a blanket growth temperature range. In one example, gases including hydrogen can be used. For example, hydrogen and inert gas combinations may be used. In one example, hydrogen combined with argon or nitrogen gas can be used. According to embodiments, a pre-bake process can reduce levels of impurities at a planarized surface.

According to embodiments of the application, low-defectivity, compressively-strained Ge on polished $Si_{0.2}Ge_{0.8}$ fabricated in oxide-trenches using ART techniques was achieved. In one example, a pre-bake process used a corresponding temperature range around 760° C. to 860° C. In a further example, a pre-bake process can use a temperature range between 780° C. to 840° C., a range between 800° C. to 820° C., or a temperature around 810° C., however, such temperature ranges are not intended to be so limited as a temperature range will vary with materials and/or conditions actually used. For example, should silicon content be reduced (e.g., $Si_{0.1}Ge_{0.9}$), a corresponding temperature range may increase.

Exemplary embodiments of low defect, strained semiconductor crystalline material having a reduced surface roughness, semiconductor devices and methods for fabricating and using the same described above disclosed undoped semiconductor materials. However, the present general inventive concept can be applied to n-doped semiconductor materials or p-doped semiconductor materials at known concentration for devices such as those described above with similar results.

In one embodiment, crystalline material 140 may have less than about $1 \times 10^6$ line defects/$cm^2$ (e.g., above the defect trapping region 155). Alternatively, crystalline material 140 may have a line defect density of about $1 \times 10^7$ defects/$cm^2$ to $1 \times 10^8$ defects/$cm^2$ or less. Alternatively, crystalline material 140 may be substantially free of line defects and/or plane defects. According to one embodiment, crystalline material 190 can have a defectivity characteristic matching the underlying crystalline material 140. Dopants are typically added to a semiconductor material to increase its charge carriers (electrons or holes); as is understood in the art, and for the purpose of this application, defects are not considered to include dopants.

As described above, according to embodiments of the application, low-defectivity, compressively-strained Ge on $Si_{0.2}Ge_{0.8}$ was fabricated in oxide-trenches using ART techniques. Pre-bake step in $H_2$ prior to thin Ge growth on coplanar $Si_{0.2}Ge_{0.8}$ with oxide trenches achieved substantially defect-free and smooth Ge. When a cleaning or bake temperature was too low below 750° C., removal of interfacial impurities at Ge/$Si_{0.2}Ge_{0.8}$ was insufficient resulting in defective Ge. Oxygen concentration was reduced from $2 \times 10^{21}$ $cm^3$ to $4 \times 10^{19}$ $cm^3$ by the 810° C. pre-bake. When a cleaning or bake temperature is too high over 870° C., SiGe surface was undulated along the trenches and its roughness was increased from 0.54 to 9.64 nm from 5 μm×5 μm scans using atomic force microscopy. Using the optimum tested pre-bake at 810° C., 42-nm-thick compressively-strained Ge was grown having 1% and 0.45% elastic strain along and perpendicular to the trench direction, respectively. Thus, embodiments according to the invention have excellent compatibility with silicon CMOS because of low defects levels, small layer thickness and a low thermal budget.

A silicon CMOS device may be processed to include embodiments of the invention; therefore, embodiment of devices such as LEDs or photovoltaic devices according to the invention integrated with CMOS process may be fabricated. For example, a silicon CMOS process can fabricate semiconductor devices (e.g., transistors) or elements (e.g., an electrode, contact hole, contacts) before or after embodiments according to this application for integration. Further, structures and/or methods according to disclosed embodiments can be used for integration of non-Si channel or active regions for next generation CMOS and for a wide variety of other applications.

As noted above, this invention has a wide variety of applications. While not limited to ART technology, this invention has many applications within ART technology. For example, use of this invention may be used to create strained Ge over a SiGe alloy grown in an opening within an insulator. One or both of the Ge and SiGe layers may be grown in accordance with the invention and/or may have a surface of reduced roughness. A wide variety of devices may incorporate the invention. While not limiting to these devices, the invention may be particularly applicable to mixed signal applications, field effect transistors, quantum tunneling devices, light emitting diodes, laser diodes, resonant tunneling diodes and photovoltaic devices, especially those using ART technology. Application Ser. No. 11/857,047 filed Sep. 18, 2007 entitled "Aspect Ratio Trapping for Mixed Signal Applications"; application Ser. No. 11/861,931 filed Sep. 26, 2007 entitled "Tri-Gate Field-Effect Transistors formed by Aspect Ratio Trapping"; application Ser. No. 11/862,850 filed Sep. 27, 2007 entitled "Quantum Tunneling Devices and Circuits with Lattice-mismatched Semiconductor Structures"; application Ser. No. 11/875,381 filed Oct. 19, 2007 entitled "Light-Emitter-Based Devices with Lattice-mismatched Semiconductor Structures"; and application Ser. No. 12/100,131 filed Apr. 9, 2007 entitled "Photovoltaics on Silicon" are all hereby incorporated by reference as providing examples to which aspects of this invention may be particularly suited.

Any reference in this specification to "one embodiment," "an embodiment," "example embodiment," etc., means that a particular feature, structure, or characteristic described in connection with the embodiment can be included or combined in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc. In addition, exemplary diagrams illustrate various methods in accordance with embodiments of the present disclosure. Such exemplary method embodiments are described herein using and can be applied to corresponding apparatus embodiments, however, the method embodiments are not intended to be limited thereby.

Although few embodiments of the present invention have been illustrated and described, it would be appreciated by those skilled in the art that changes may be made in these embodiments without departing from the principles and spirit of the invention. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein. As used in this disclosure, the term "preferably" is non-exclusive and means "preferably, but not limited to." Terms in the claims should be given their broadest interpretation consistent with the general inventive concept as set forth in this description. For example, the terms "coupled" and "connect" (and derivations thereof) are used to connote both direct and indirect connections/couplings. As another example, "having" and "including", derivatives thereof and similar transitional terms or phrases are used synonymously with "comprising" (i.e., all are considered "open ended" terms)—only the phrases "consisting of" and "consisting essentially of" should be considered as "close ended". Claims are not intended to be interpreted under 112 sixth paragraph unless the phrase "means for" and an associated function appear in a claim and the claim fails to recite sufficient structure to perform such function.

What is claimed is:

1. A method of manufacturing a semiconductor structure, the method comprising:
   providing a semiconductor crystalline substrate;
   forming an insulator defining openings to a surface of the substrate; and
   growing a first semiconductor crystalline material lattice-mismatched with the substrate within the openings of the insulator;
   polishing a top surface of the first semiconductor crystalline material and the insulator;
   growing a second semiconductor crystalline material over the polished first semiconductor crystalline material; and
   before growing the second semiconductor crystalline material, heating the polished top surface at a selected temperature range to reduce impurities at the interface of the first and second semiconductor crystalline material.

2. The method of claim 1, wherein the heating comprises heating at temperatures between 760° C. to 860° C.

3. The method of claim 1, wherein a top surface of the second semiconductor crystalline material has a surface roughness root-mean-square (RMS) of about 5 nm or less, about 3 nm or less, about 1 nm or less, about 0.5 nm or less, or no greater than 0.3 nm.

4. The method of claim 1, wherein the interface has reduced oxygen impurity concentrations.

5. The method of claim 1, wherein the second semiconductor crystalline material is elastically strained at least along a first direction relative to an opening, along a second direction perpendicular to the first direction or along both the first and second directions.

6. The method of claim 1, wherein the openings have an aspect ratio sufficient to trap defects in the first semiconductor crystalline material, and further comprising forming a semiconductor device at least in part in an opening.

7. The method of claim 1, wherein the heating comprises heating at a temperature range independent of a temperature used in the growing a second semiconductor crystalline material.

8. A method of manufacturing a semiconductor structure comprising:
   epitaxially growing by chemical vapor deposition (CVD) a first semiconductor crystalline material on a polished surface of a lattice-mismatched semiconductor crystalline material exposed within an opening of an insulator; and
   before epitaxially growing the first semiconductor crystalline material, cleaning the polished surface by heating to reduce an oxygen impurity concentration below a prescribed level.

9. The method of claim 8, wherein the first semiconductor crystalline material is a group IV element or compound including at least one group IV element.

10. The method of claim 8, wherein the epitaxially growing step includes growing strained Ge on a SiGe alloy.

11. The method of claim 8, wherein the heating comprises heating at temperatures between 760° C. to 860° C.

12. The method of claim 8, wherein a top surface of the first semiconductor crystalline material has a surface roughness root-mean-square (RMS) of about 5 nm or less.

13. The method of claim 8 further comprising:
   epitaxially growing the lattice-mismatched semiconductor crystalline material from a substrate within the opening of the insulator; and
   polishing a top surface of the lattice-mismatched semiconductor crystalline material and the insulator with a chemical mechanical polishing process, wherein after the polishing, top surfaces of the lattice-mismatched semiconductor crystalline material and the insulator are level.

14. The method of claim 13, wherein after epitaxially growing the lattice-mismatched semiconductor crystalline material, the lattice-mismatched semiconductor crystalline material has a top surface higher a top surface of the insulator.

15. The method of claim 8, wherein the opening in the insulator has an aspect ratio sufficient to trap defects in the lattice-mismatched semiconductor crystalline material, and further comprising forming a semiconductor device at least in part in the opening of the insulator.

16. A method comprising:
forming an insulator layer over a substrate, the insulator layer having openings exposing the substrate;
epitaxially growing a first semiconductor crystalline material from the substrate within the openings of the insulator layer, wherein after epitaxially growing the first semiconductor crystalline material, the first semiconductor crystalline material has a top surface above a top surface of the insulator layer;
performing a chemical mechanical polishing process on the top surface of the first semiconductor crystalline material and the top surface of the insulator layer to level the top surfaces the first semiconductor crystalline material and the insulator layer;
heating the polished top surface of the first semiconductor crystalline material; and
after heating the polished top surface of the first semiconductor crystalline material, epitaxially growing a second semiconductor crystalline material from the polished top surface of first semiconductor crystalline material.

17. The method of claim 16, wherein heating the polished top surface of the first semiconductor crystalline material reduces an oxygen impurity concentration at an interface of the first and second semiconductor crystalline material.

18. The method of claim 16, wherein a top surface of the second semiconductor crystalline material has a surface roughness root-mean-square (RMS) of about 5 nm or less.

19. The method of claim 16, wherein the first semiconductor crystalline material is a SiGe alloy, and wherein the second semiconductor crystalline material is a strained Ge.

20. The method of claim 16, wherein the first semiconductor crystalline material is lattice mismatched to the substrate.

* * * * *